(12) United States Patent
Drost et al.

(10) Patent No.: US 8,179,208 B2
(45) Date of Patent: May 15, 2012

(54) INTERCONNECT FOR SURFING CIRCUITS

(75) Inventors: Robert J. Drost, Los Altos, CA (US); Alex Chow, Palo Alto, CA (US); Suwen Yang, Vancouver (CA); Mark R. Greenstreet, Vancouver (CA)

(73) Assignee: Oracle America, Inc., Redwood Shores, CA (US)

( * ) Notice: Subject to any disclaimer, the term of this patent is extended or adjusted under 35 U.S.C. 154(b) by 807 days.

(21) Appl. No.: 12/252,808

(22) Filed: Oct. 16, 2008

(65) Prior Publication Data

US 2009/0102581 A1    Apr. 23, 2009

Related U.S. Application Data

(60) Provisional application No. 60/982,080, filed on Oct. 23, 2007.

(51) Int. Cl.
*H03H 7/20* (2006.01)
(52) U.S. Cl. .................. 333/139; 333/24 C; 333/164
(58) Field of Classification Search .......... 327/261–266, 327/269–274, 276–281; 333/1, 2, 24 C, 333/18, 138–140, 156, 164
See application file for complete search history.

(56) References Cited

U.S. PATENT DOCUMENTS

| | | | | |
|---|---|---|---|---|
| 5,705,947 A * | 1/1998 | Jeong | ............................. | 327/270 |
| 6,448,833 B2 * | 9/2002 | Hirose | ........................... | 327/284 |
| 7,363,401 B1 * | 4/2008 | Rajagopalan | ................... | 710/60 |
| 7,456,670 B2 * | 11/2008 | Mahanavelu et al. | ......... | 327/261 |
| 7,528,669 B2 * | 5/2009 | Milicevic et al. | ................ | 331/57 |
| 7,545,194 B2 * | 6/2009 | Chen et al. | ..................... | 327/276 |
| 7,564,284 B2 * | 7/2009 | Henzler et al. | ................ | 327/261 |
| 2006/0198235 A1 * | 9/2006 | Mohanavelu et al. | ......... | 365/233 |

OTHER PUBLICATIONS

Papaix et al., "A new single ended sense amplifier for low votlage embedded EEPROM non volatile memories", 2002, p. 1-5.*

* cited by examiner

*Primary Examiner* — Dean O Takaoka
*Assistant Examiner* — Alan Wong
(74) *Attorney, Agent, or Firm* — Park, Vaughan, Fleming & Dowler LLP

(57) ABSTRACT

An interconnect for surfing circuits is presented. The interconnect includes at least one control signal line, at least one data signal line, and at least one variable capacitor coupled to the at least one control signal line and the at least one data signal line, wherein the capacitance of the variable capacitor is configured to be controlled by a control signal on the control signal line so that a velocity of a data signal transmitted on the at least one data signal line is determined by the value of the capacitance of the variable capacitor.

19 Claims, 25 Drawing Sheets

INTERCONNECT FOR SURFING CIRCUITS

RELATED APPLICATION

This application hereby claims priority under 35 U.S.C. §119 to U.S. Provisional Patent Application No. 60/982,080 filed 23 Oct. 2007, entitled "LOW LATENCY WIRES WITH CLOCKED DISTRIBUTED AMPLIFIERS," by inventors Robert J. Drost, Alex Chow, Suwen Yang, and Mark Greenstreet.

BACKGROUND

1. Field of the Invention

The present invention relates to interconnects for surfing circuits.

2. Related Art

With growing chip sizes and operating frequencies, the on-chip global interconnect has become a critical performance bottleneck for CMOS technology. More specifically, as process technologies move to deep submicron feature sizes, transistor delays continue to decrease. However, interconnect delays are not following the same trend. For example, FIG. 2 shows an exemplary delay trend for global interconnects in microprocessors. Note that the gap between the interconnect delay and the fan-out-of-four inverter delay (FO4 delay), continues to increase. Buffers can be inserted into the interconnect to reduce the delay, and a substantially minimal delay can be achieved when wire delay matches buffer delay and when wire capacitance matches buffer capacitance. Because power consumption grows linearly with total capacitance, inserting buffers into the interconnect to reduce the delay of the interconnect has the undesirable effect of increasing the power consumption of the interconnect. While this increase in power consumption can be reduced by sizing buffers and wires to minimize the energy-delay product, power consumption remains a critical issue for long-wire interconnects.

Increasing the bandwidth of the interconnect is desirable to improve system performance. However, bandwidth is limited by timing variations caused by skew and jitter. Timing variations are a function of temperature variation, crosstalk noise, power supply variation, and parameter variation, and timing variations increase with the length of global interconnect lines. Moreover, jitter and skew in clock signal for a transmitter and a receiver add timing variation to on-chip interconnect communications.

The total timing uncertainty limits the bandwidth of the system. To reduce the timing uncertainty of the global interconnect, substantial effort have been invested into reducing clock skew and jitter. Unfortunately, this can lead to a complex clock network with high power consumption. One solution to this problem is to insert latches in place of some of the buffers to control the timing variation. However, these latches increase latency and consume extra power.

Hence, what is needed is an interconnect for surfing circuits without the above mentioned problems.

SUMMARY

Some embodiments of the present invention provide an interconnect that includes at least one control signal line, at least one data signal line, and at least one variable capacitor coupled to the at least one control signal line and the at least one data signal line, wherein the capacitance of the variable capacitor is configured to be controlled by a control signal on the control signal line so that a velocity of a data signal transmitted on the at least one data signal line is determined by the value of the capacitance of the variable capacitor.

In some embodiments, the interconnect is a transmission line.

In some embodiments, the transmission line is operating in an inductance-capacitance (LC) mode.

In some embodiments, the interconnect includes at least one negative conductance device configured to restore a signal level of a signal transmitted on the at least one data signal line.

In some embodiments, the at least one negative conductance device is a sense amplifier.

In some embodiments, the at least one negative conductance device is at least one pair of cross-coupled inverters.

In some embodiments, the variable capacitor is a varactor.

In some embodiments, the varactor is a metal-oxide semiconductor (MOS) transistor.

In some embodiments, the varactor is a PN-junction varactor.

In some embodiments, the at least one control signal line includes at least one negative conductance device.

In some embodiments, the at least one control signal line includes a pair of differential signal lines for a control signal.

In some embodiments, the at least one data signal line includes a pair of differential signal lines for a data signal.

In some embodiments, the control signal is a clock signal.

In some embodiments, the interconnect is included in an integrated circuit chip.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description can be embodied as code, data structures, and/or data, which can be stored on a computer-readable storage medium as described above. When a computer system reads and executes the code and/or data stored on the computer-readable storage medium, the computer system performs the methods and processes embodied as code, data structures, and/or data that are stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Computer System

Figure 1:
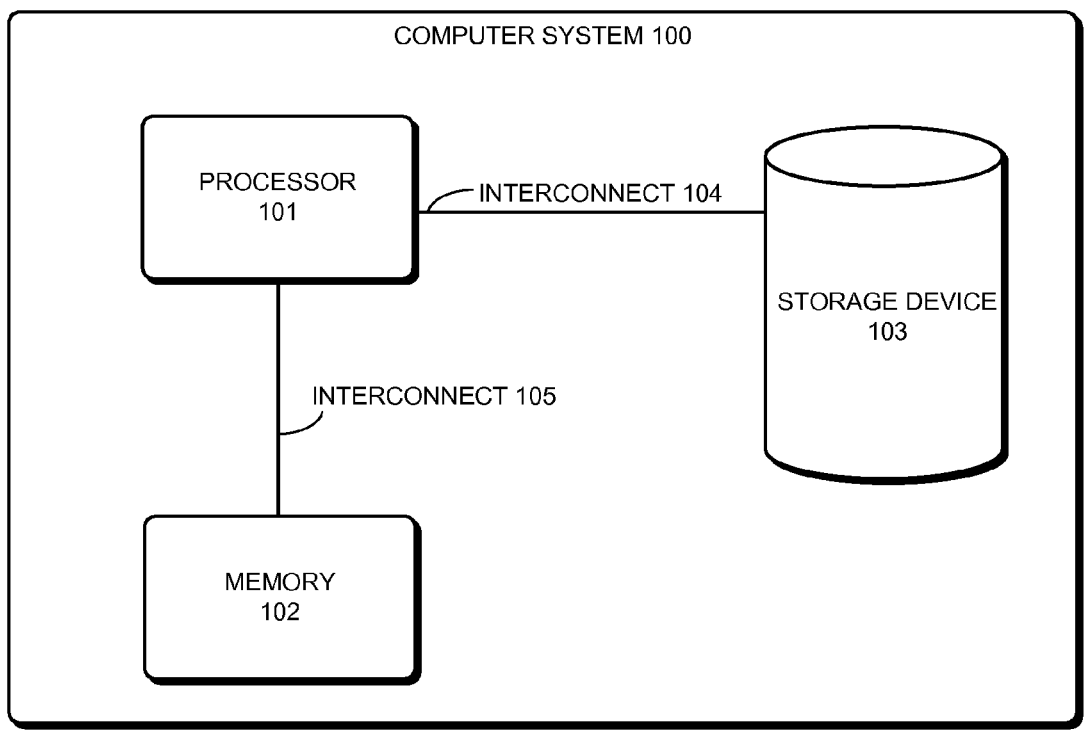
FIG. 1 presents a block diagram of a computer system in accordance with some embodiments.
Figure 2:
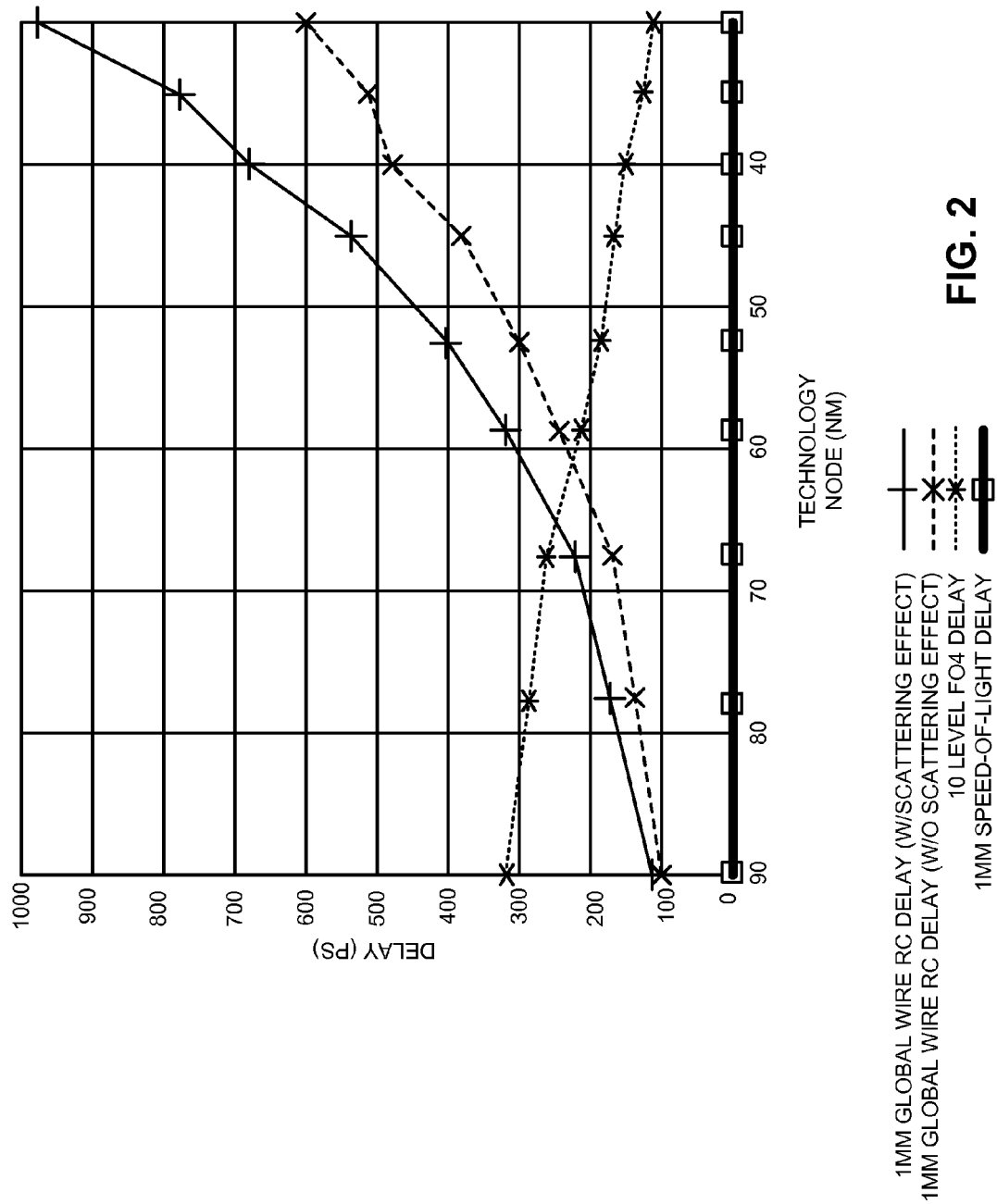
FIG. 2 shows a delay trend for global interconnects in microprocessors in accordance with some embodiments.

FIG. 1 presents a block diagram illustrating a computer system 100 in accordance with an embodiment of the present invention. Computer system 100 includes processor 101, memory 102, storage device 103, and interconnects 104-105.

Processor 101 can generally include any type of processor, including, but not limited to, a microprocessor, a mainframe computer, a digital signal processor, a personal organizer, a device controller and a computational engine within an appliance. Memory 102 can include any type of memory, including but not limited to, dynamic random access memory (DRAM), static random access memory (SRAM), flash memory, read only memory (ROM), and any other type of memory now known or later developed. Storage device 103 can include any type of non-volatile storage device that can be coupled to a computer system. This includes, but is not limited to, magnetic, optical, and magneto-optical storage devices, as well as storage devices based on flash memory and/or battery-backed up memory.

In some embodiments, interconnects 104-105 are interconnects for surfing circuits as described below. In some embodiments, one or more of processors 101, memory 102, and storage device 103 include interconnects for surfing circuits.

On-Chip Synchronous Communication

Figure 3:
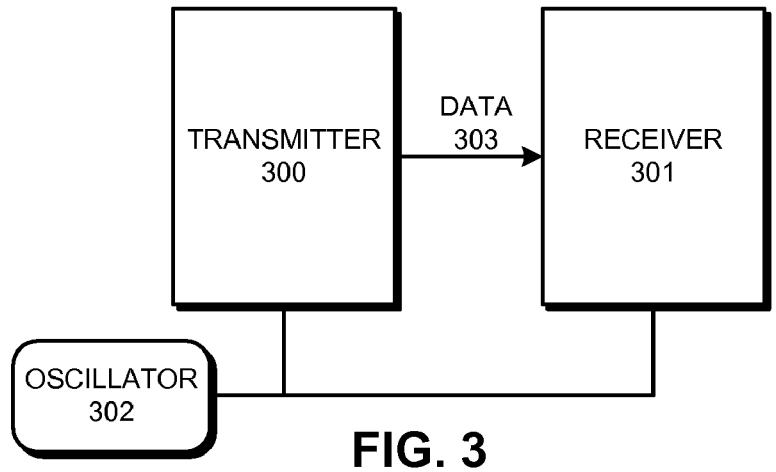
FIG. 3 presents a block diagram of an exemplary global synchronous communication system in accordance with some embodiments.
Figure 4:
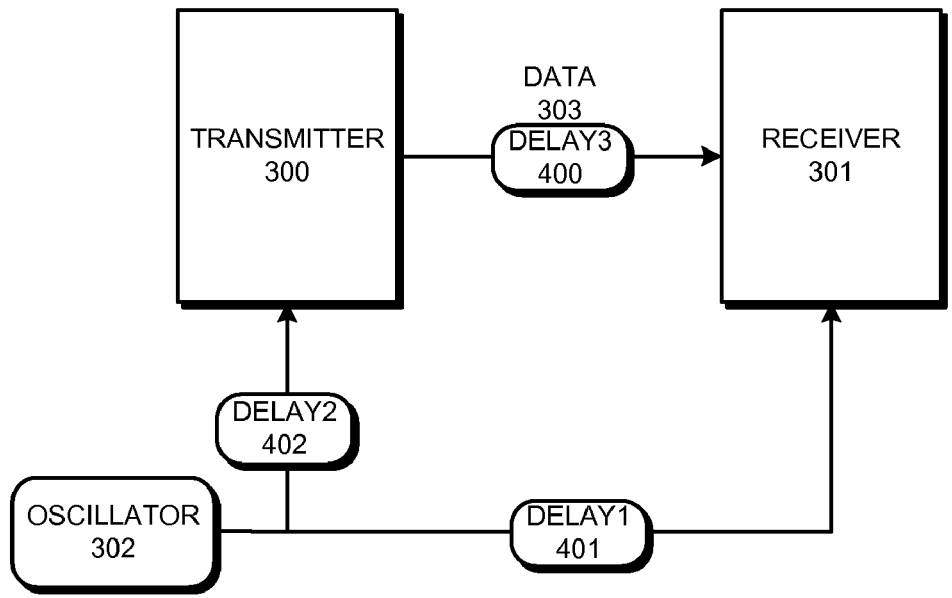
FIG. 4 presents a block diagram of an exemplary global synchronous communication system in accordance with some embodiments.

On-chip timing: There are several methods for synchronous communication, including, but not limited to: globally synchronous, source synchronous and self-synchronous. FIG. 3 presents a block diagram of an exemplary global synchronous communication system in accordance with some embodiments. Both the transmitter 300 and the receiver 301 are clocked by a global clocking signal generated by an oscillator 302, wherein the transmitter 300 transmits the data 303 to the receiver 301 that is synchronized with the global clocking signal. FIG. 4 illustrates the delays 400-402 which result from interconnect delays. These delays must be accounted for to ensure that the receiver 301 reliably receives the data 303. As illustrated in FIG. 4, the skew in the global clock network and the timing variation in the interconnect between transmitter and receiver both contribute to the timing uncertainty of the system. For large chips, it becomes difficult to design a low skew clock network. Thus, a globally synchronous communication system can be expensive to implement. Furthermore, system on a chip (SOC) designs may use blocks that may operate at different frequencies, further complicating the task of designing a globally synchronous communication system.

Figure 5:
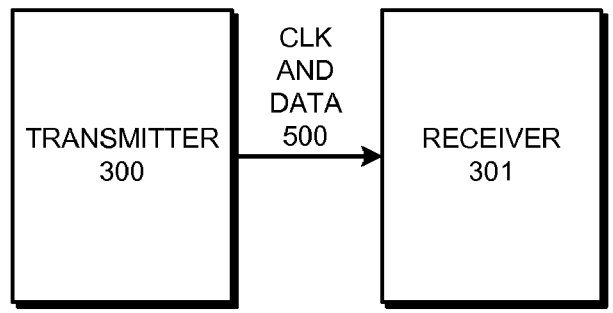
FIG. 5 presents a block diagram of an exemplary self-synchronous communication system in accordance with some embodiments.
Figure 6:
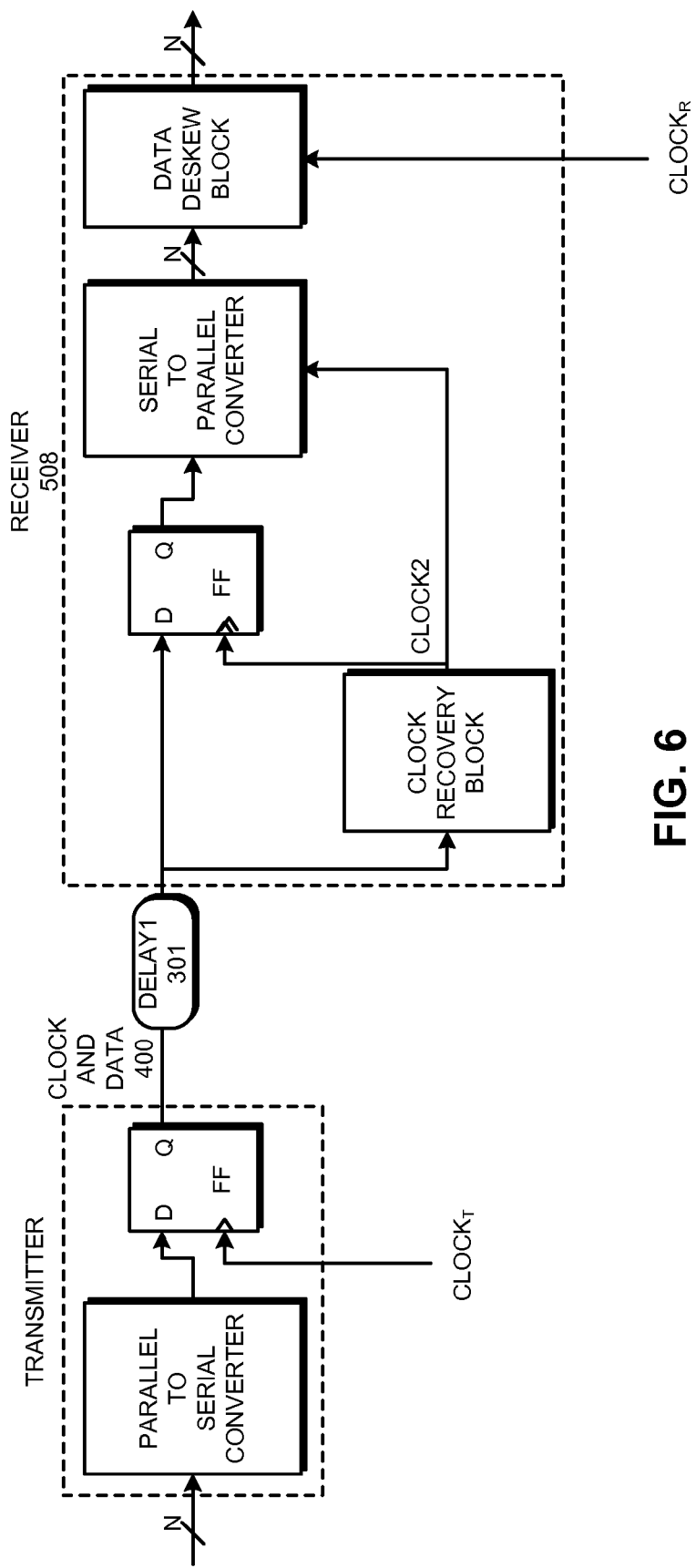
FIG. 6 presents a block diagram of an exemplary self-synchronous communication system in accordance with some embodiments.

In self-synchronous design as shown in FIG. 5, the data stream includes data and clock information 500 (e.g., 4-out-of-5 or delay insensitive codes). FIG. 6 shows a more detailed schematic of the self-synchronous design illustrated in FIG. 5. This design is often used for serial communication. Thus, the transmitter has a parallel-to-serial converter, and the receiver has a serial-to-parallel converter. The receiver also has a clock recovery block to generate a clock with frequency and phase matching those of the received data. Such circuits are relatively large, power intensive, and require sophisticated analog designs. The clock recovery block uses the historical clock information of the receiver to generate clock2. Thus, clock2 may be out-of-phase with the transmitter clock $clock_t$ due to jitter in the clock oscillators, network and link. Thus, the coding technique for embedding the clock must provide enough phase information for the clock recovery circuit to adequately track the transmitter's clock. This coding technique lowers the throughput of the link. After deserialization, the data is sent through the deskewing block to resynchronize to receiver's clock $clock_r$.

Figure 7:
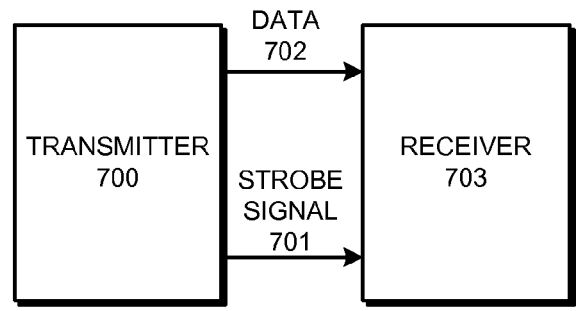
FIG. 7 presents a block diagram of an exemplary source-synchronous communication system in accordance with some embodiments.
Figure 8:
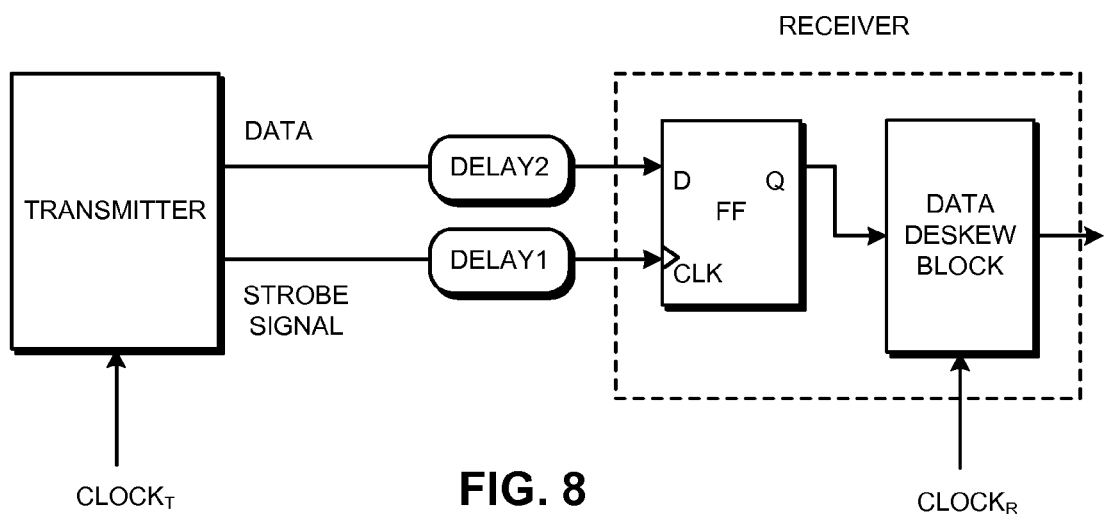
FIG. 8 presents a block diagram of an exemplary source synchronous communication system in accordance with some embodiments.

Source-synchronous signaling (see FIG. 7) is typically used for parallel communication. During this process, the transmitter 700 sends a strobe signal 701 along with the data 702 to the receiver 703. As illustrated in FIG. 8, a sampling circuit (e.g., a flip-flop) in the receiver uses the strobe signal to process the data. A data deskew block converts the data from the received clock domain to its own clock domain $clock_r$. As illustrated in FIG. 8, the sampling circuit only needs to consider the timing variation between the data and strobe signal. A source-synchronous design can simplify global timing closure because it does not require bounding the relative skew between the transmitter and receiver. However, the routing of the data and the strobe signals lines must be set so that the delays for the data and strobe signals are substantially matched. By sending the data and strobe signals on adjacent wires, this delay matching can be achieved by local analysis of each segment of the line. Note that the jitter of $clock_r$ may add extra timing uncertainty to the source synchronous communication system that must be handled by the deskew block.

Asynchronous handshaking can also be used for on-chip communication. In asynchronous handshaking, the transmitter sends a request to the receiver either embedded in the data or along a delay-matched line with the data. The receiver sends an acknowledgment back to the transmitter to confirm receipt of each datum. Note that the transmitter does not send another datum until it gets an acknowledgment from the receiver. The asynchronous handshaking relies on the communication protocol instead of the clock signal in the synchronous communication. Thus, this approach does not need to consider the jitter in the clock network and line and issues of global timing closure are avoided. The handshaking protocol introduces overhead because of the need to interface these asynchronous circuits with functional units that are typically synchronous.

Figure 9:
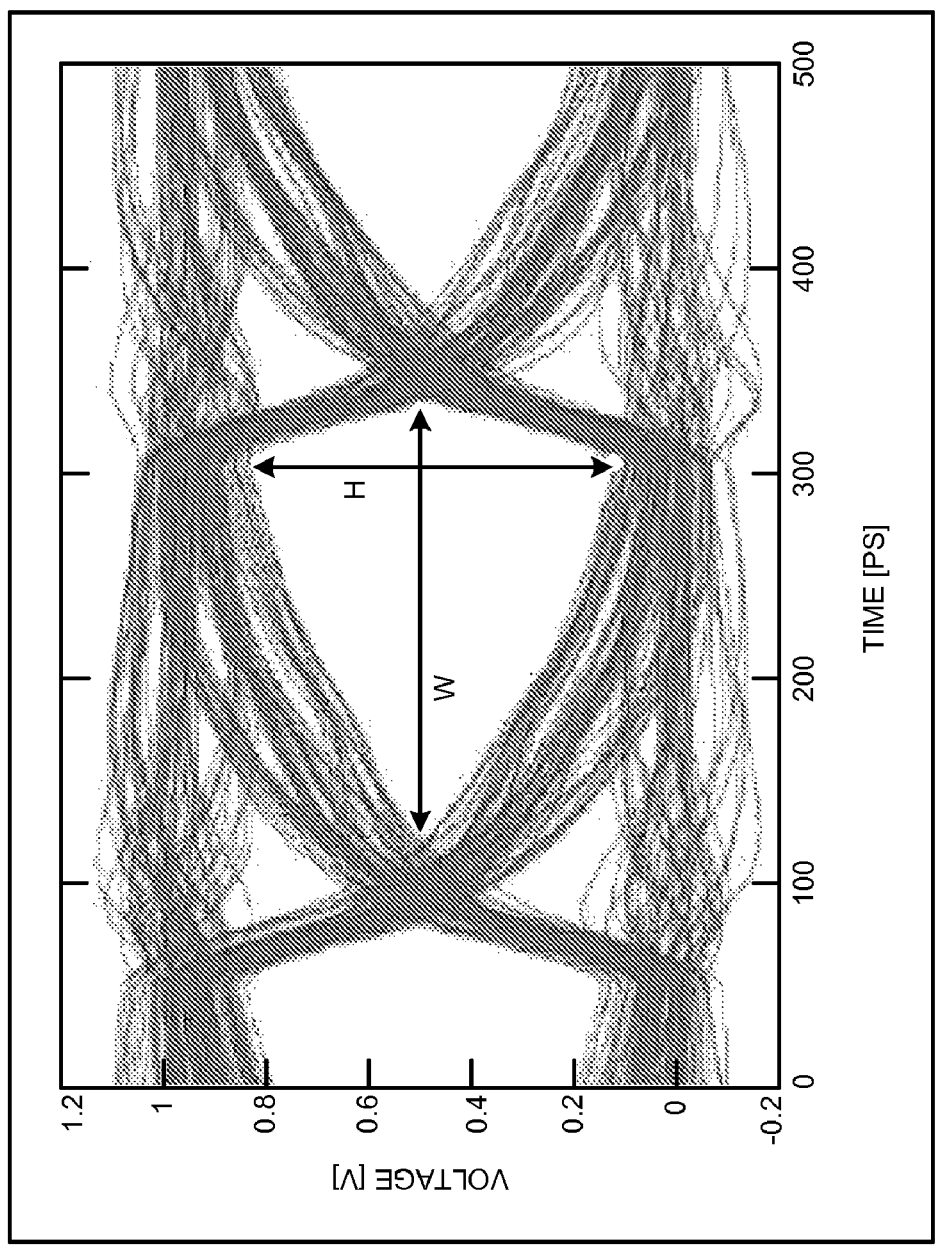
FIG. 9 presents an exemplary eye diagram graph for a communication system in accordance with some embodiments.

Eye diagrams are commonly used to characterize disturbances in a communication system. FIG. 9 is an exemplary eye diagram graph for a communication system in accordance with some embodiments. A robust communication system requires enough eye height H to distinguish different symbols and enough eye width W to accommodate jitter in the system. The non-uniform attenuation of lossy interconnect can distort the symbol. Power supply variation and crosstalk noise can also affect the eye height. The transmitter can use a large swing signal to overcome the noise and attenuation such that at the end of the line, the receiver can properly detect the transmitted symbols. For long distance communication, this technique can cause the transmitter to consume large amount of power. Furthermore, generating large swing signals can induce crosstalk between nearby signal lines. Another technique to improve the signal quality of the interconnect is to add amplifiers into the interconnect to compensate for the attenuation of the signal as the signal traverses the interconnect. To improve the noise margin, the amplifiers are not only required to have enough gain, but must also achieve a saturation characteristic such that the amplifier will not amplify noise. For example, full-swing CMOS inverters provide both gain and saturation. However, low-swing circuits may not be able provide the gain while minimizing the amplification of noise.

Timing uncertainty is typically caused by jitter (e.g., clock jitter), relative jitter between data and strobe signal in the source-synchronous communication, and delay variations of the interconnect. The total jitter puts a constraint on the minimum width of the eye diagram and thus limits the throughput of the system. The jitter in the receiver's or transmitter's clock depends on the clock oscillators and network design. The relative jitter between the strobe signal and symbol is typically caused by the different environments faced by the data line and clock line (e.g., different layouts of the lines, different neighboring signals, etc.). Crosstalk noise, power supply variation, and temperature variation can also cause delay variation on the interconnect.

Figure 10:
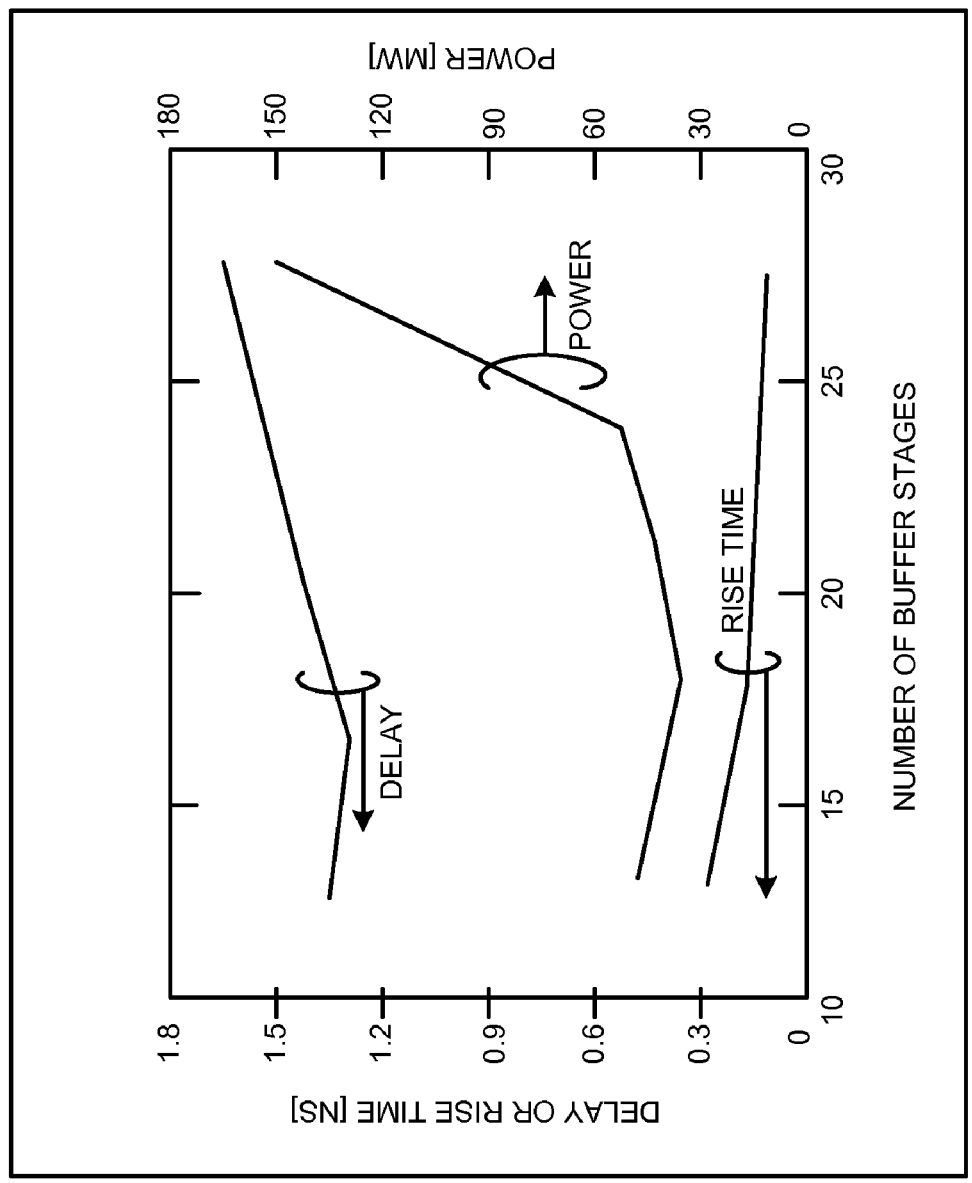
FIG. 10 presents an exemplary graph of the delay of an interconnect as a function of the number of buffers inserted onto the interconnect in accordance with some embodiments.

Signaling Method: Latency is also an important figure of merit to evaluate the performance of a communication system. The typical approach to reduce the interconnect delay is to insert buffers onto the interconnect. Without buffers, the delay of a RC line grows quadratically with the wire length. The buffers divide a line into several segments. Thus, the total delay is the sum of the delay on each segment and the total delay grows linearly with the line length. FIG. 10 plots the delay and power consumption versus the number of buffer stages for a given wire (e.g., 0.44 µm wide, 0.46 µm spacing, 20 mm long, for an exemplary 0.18 µm fabrication technology) shows that the rise time decreases as the number of buffer stages on the interconnect increases. The power consumption decreases initially because the short-circuit power decreases as the rise time decreases. However, the power consumption increases dramatically as the number of buffer stages increases past a specified number of buffer stages because dynamic power begins to dominate. As the number of buffer stages increases, the delay increases when the inverter intrinsic delay dominates the wire delay. Even with optimization, this design reaches a limit where the power consumption and delay cannot be further reduced. Another disadvantage of RC signaling is that jitter can accumulate along a buffer chain. Even if all of the inverters in a buffer chain are the same, and all of the wires are of the same length, random variations due to power-supply noise, crosstalk, temperature variation, and intra-chip parameter variation add jitter at each buffer stage, and this jitter is cumulative. Furthermore, intersymbol interference (ISI) effects (e.g., "drafting") can amplify jitter. The random walk of edge timing and the jitter amplification of intersymbol interference can cause a sufficiently long buffer chain to drop pulses even when operating at low clock frequencies. Phase-locked loops (PLLs) and delay-locked loops (DLLs) can overcome the limitations of simple buffer chains by actively compensating for jitter. Unfortunately, these circuits require much more power and layout area than simple buffer chains. Thus, it is not practical in most applications, to forward a clock for a source-synchronous link using a traditional PLL or DLL at each repeater stage.

Figure 11:
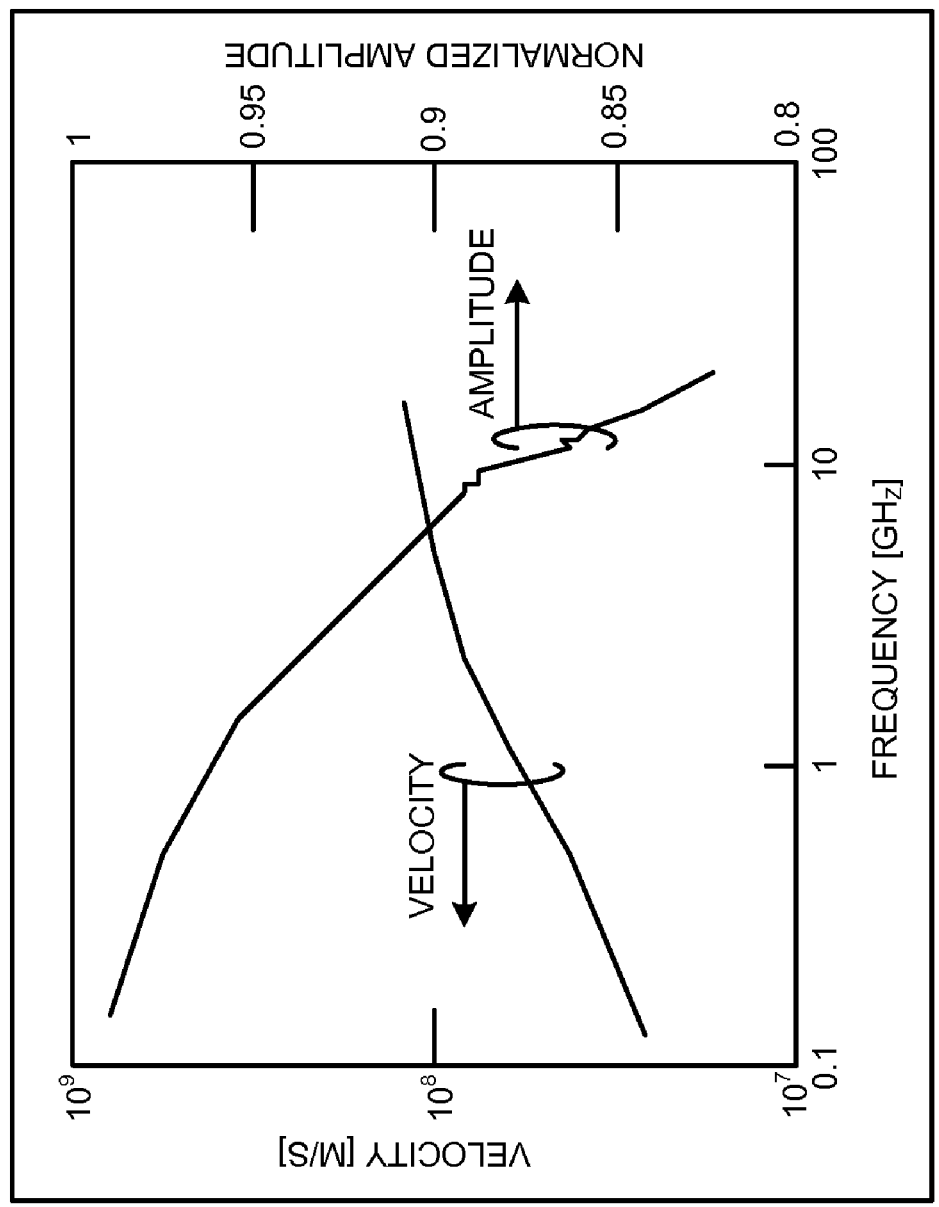
FIG. 11 presents an exemplary graph of the velocity and attenuation of a signal in an interconnect operating in an LC mode as a function of the frequency of the signal in accordance with some embodiments.

An alternative to RC signaling is LC signaling. On-chip wires can be modeled as distributed rlc lines. At low frequencies, the effects of wire resistance dominate the effect of wire inductance, and the wire can be accurately approximated as an rc transmission line. Data is propagated in such lines according to the diffusive mode of the line, and wire delay grows quadratically with length. At high frequencies, the effects of wire inductance become dominant, and the wire can be approximated as a lossy transmission line where the velocity is given by $$\frac{1}{\sqrt{lc}},$$

the speed-of-light in the dielectric, and attenuation is exponential at a rate of $$\frac{r}{2Z_0}$$

where $$Z_0 = \sqrt{\frac{l}{c}}$$

is the characteristic impedance of the corresponding lossless line. LC transmission lines are attractive for at least two reasons. First, wave propagation in the LC line is much faster than the diffusive propagation of RC lines. Second, wave propagation consumes substantially less power than diffusive propagation, because there is no need for the driver/transmitter to charge the whole wire during the transmission of a symbol. Various techniques can be used to achieve lc behavior in interconnect/wires (e.g., high-frequency, near speed-of-light response of the lines). However, the line resistance can introduce distortion into the transmitted symbols. As shown in FIG. 11, at different frequencies, the velocity and attenuation rate are not the same. Note that velocity dispersion causes intersymbol interference and can limit the bandwidth of the interconnect. The high attenuation rate at high frequencies can limit the length of the interconnect, thus, complicating the design of receivers. Techniques such as nonlinear transmission lines, the surfliner technique, and short pulse signaling, may solve the velocity dispersion problem. For these design techniques, repeaters/buffers are added in series to facilitate long distance communication. However, repeaters can add extra delay and increase power consumption. Distributed amplifiers shunted in the line can provide active compensation to reduce the attenuation rate. In a dielectric, the propagation speed of LC signaling is relatively insensitive to power supply noise and temperature variation. Also, jitter in LC signaling may be smaller than the jitter in RC signaling. However, jitter may still exist due to the random variation caused by line mismatches and crosstalk noise.

RC signaling is simple. However, it suffers from intersymbol interference and jitter accumulation. More importantly, RC lines may become a performance bottleneck for many designs because of their high latency. On the other hand, LC signaling requires distributed amplifiers for long distance communication to overcome the attenuation of the interconnect. LC signaling also suffers from intersymbol interference caused by velocity dispersion.

One advantage of LC signaling is that may approach the speed-of-light in a given medium. LC techniques typically use wide and thick interconnect to reduce the resistance on the line. LC signaling can also use wide spacing between wires to increase the inductance in the line. Note that a larger inductance improves the characteristic impedance of the line and can reduce the attenuation rate. Thus, LC signaling may use more area than RC signaling, and may lower the bandwidth per unit cross-section.

Optical interconnects and wireless interconnects can also be used. However, optical designs require conversion of signals between the electrical and optical domains and wireless interconnect requires a wireless carrier signal. The overhead for these techniques may result in more complicated transmitter and receiver designs.

In summary, for both RC and LC signaling, jitter in the interconnect is inevitable due to noise disturbances. Jitter introduces timing uncertainty into the system and is difficult to quantify. Moreover, underestimation of the jitter in the interconnect may lead to unreliable designs with narrow eye diagram width. On the other hand, overestimation of the jitter in the interconnect may result in a conservative design which sacrifices the throughput.

Disturbances can also affect the voltage level of a symbol. For RC signaling, the interconnect may drop pulses due to the intersymbol interference. For LC signaling, the interconnect may attenuate the high frequency signals. Thus, in order to achieve robust on-chip communication, the timing uncertainty must be bounded and sufficient eye diagram height must be achieved.

In some embodiments, a surfing interconnect communication system provides an efficient solution for the timing problems for on-chip interconnect. This approach can reduce the complexity of receiver design and may be robust against noise and other disturbances.

In some embodiments, the RC line described below has one or more of the following properties: simple surfing delay locked loop, less relative jitter between data signal and strobe signal, higher throughput, robust against PVT variation, less power consumption. In some embodiments, surfing circuits are only enabled when necessary. Note that surfing circuits do not consume static power.

In some embodiments, the LC line described below have one or more of the following properties: it has higher signal velocities than RC signaling, varactors (i.e., variable capacitors) can be used efficiently to implement surfing LC lines, varactors can provide some eye height by reshaping pulses, varactors work as an amplifier to provide some gain, and the relative jitter between data signal and strobe signal can bounded.

RC Signaling

Buffer insertion is well understood in the art. During the buffer-insertion process, the design can be represented as an optimization problem with power, delay, bandwidth being three common objectives. The optimization variables can be the number and the size of buffers assuming fixed ratio between PMOS and NMOS transistor width. The line delay and power consumption are non-monotonic with inductance. Intersymbol interference, crosstalk and other disturbances may limit bandwidth Latches may be added to control timing uncertainties. However, latches increase the latency and power consumption.

Figure 12:
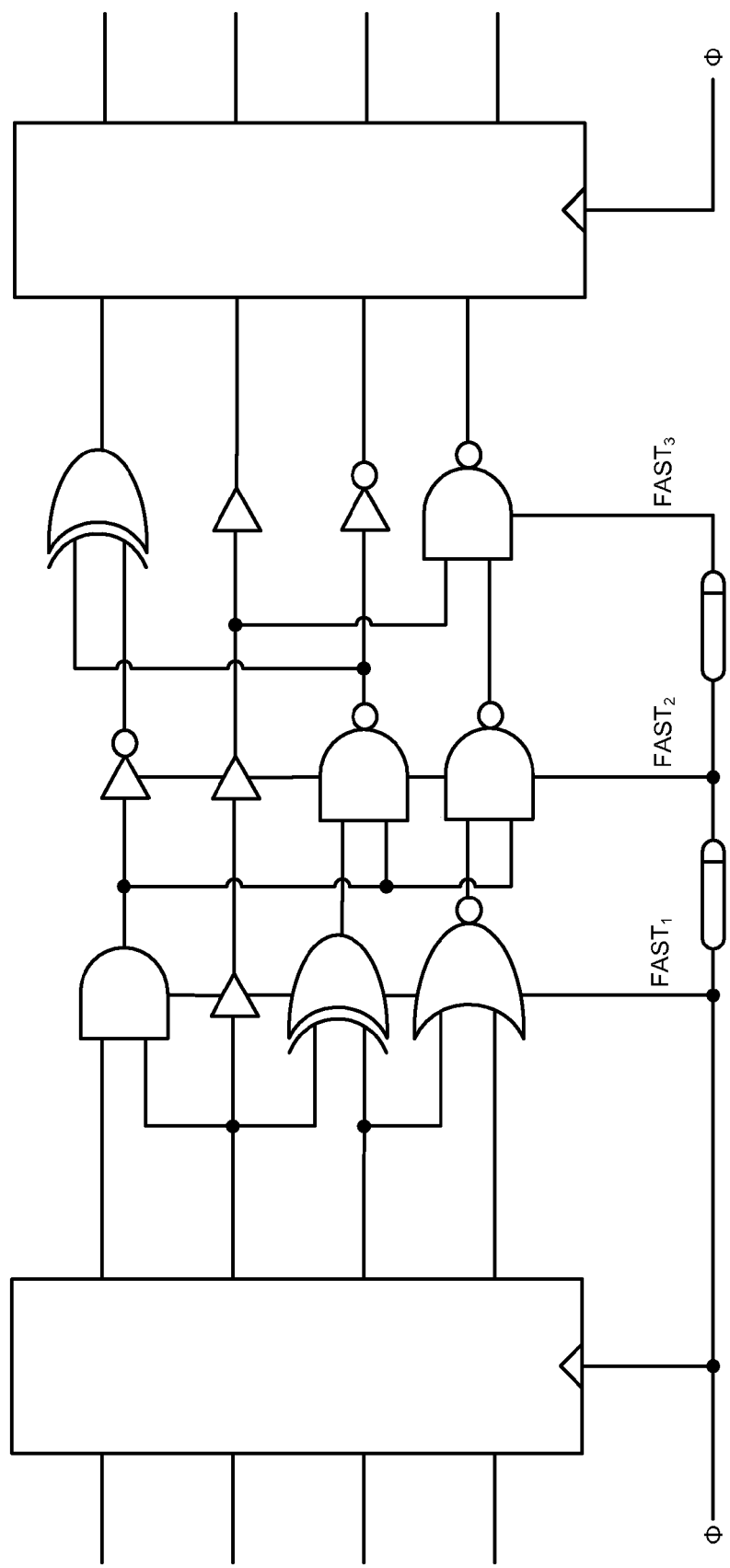
FIG. 12 presents an exemplary surfing pipeline in accordance with some embodiments.

"Surfing" signals can be used to replace a traditional pipeline (e.g., flip-flop/latch based pipelines, etc.). As shown in FIG. 12, a surfing pipeline includes a timing pulse Φ that propagates in parallel with the data path. Every logic element in the data path is augmented with a timing pulse that modulates the element's propagation delay. The surfing technique has two requirements: (1) when the timing pulse is high (e.g., logical 1), the maximum delay of the gate $\delta_{1,max}$ is less than the minimum propagation delay of the timing pulse $\delta_{f,min}$, where $\delta_1$ is the delay of the logic gate with fast=1, and $\delta_f$ is the stage-to-stage delay of the fast pulse; and (2) if the timing pulse is 0, the minimum delay of the gate $\delta_{0,min}$ is greater than the maximum delay of the timing pulse $\delta_{f,max}$, where $\delta_0$ is the delay of the logic gate with fast=0. The two requirements can be summarized by the following inequality:

$$\delta_{1,max} < \delta_{f,min} < \delta_{f,max} < \delta_{0,min} \qquad (1)$$

Figure 13:
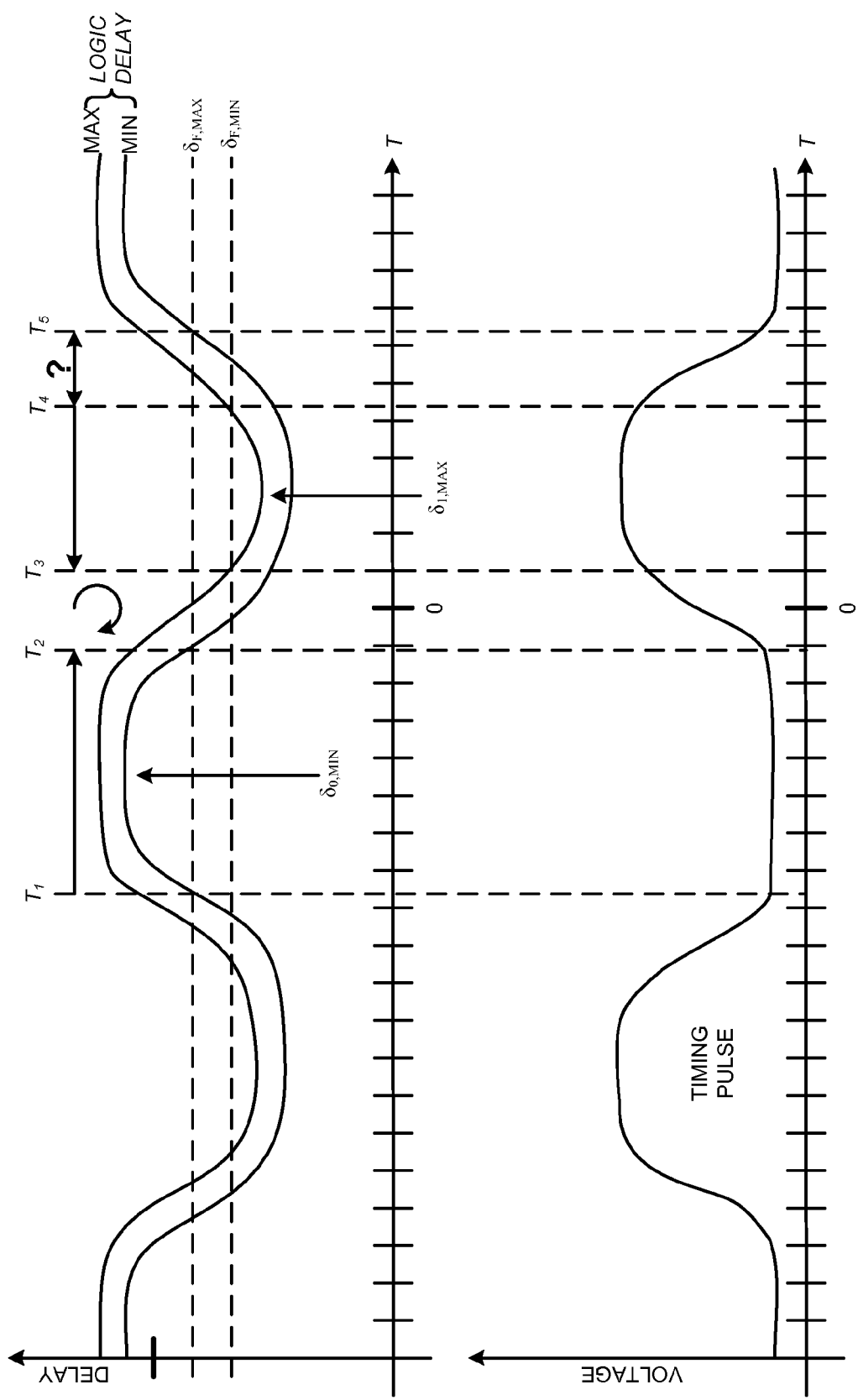
FIG. 13 presents an exemplary timing diagram for a surfing pipeline in accordance with some embodiments.

If equation (1) is satisfied, the arrival time of logic events in the data paths will be attracted to the rising edge of the timing pulse. As shown in FIG. 13, the timing pulse divides the period of the timing pulse into four intervals. The interval $[t_1, t_4]$ is the capture region. In interval $[t_1, t_2]$, the input event arrives earlier than the timing pulse, and the logic delay is greater than the propagation delay of the timing pulse. Conversely, in interval $[t_3, t_4]$, the input event arrives after the timing pulse, and the logic delay is less than the delay of the timing pulse. Whenever the input event comes in interval $[t_1, t_2]$ or $[t_3, t_4]$, the input event at the next stage will arrive closer to the timing pulse. Hence, after several stages, the input events will converge to arrive in the steady-state surfing interval $[t_2, t_3]$. The interval $[t_4, t_5]$ is the metastability interval. Events in this interval will eventually exit to surf with either the preceding wave or the following wave. Surfing creates an event attractor such that the delay spread along the data paths is kept small regardless of the pipeline length. A transparent latch is an extreme case of a surfing gate—the latch's delay goes to infinity when the latch is not enabled and drops to a bounded value when the enable signal is asserted. Surfing logic can be seen as "soft" latching. Unlike a traditional latch which slows down early arrivals, surfing designs accelerate late arrivals to achieve higher performance than purely combinational designs. Surfing increases throughput and decreases latency simultaneously, because surfing logic elements have less delay than their non-surfing counterparts. A self-resetting domino gate that can be used as a surfing gate is shown in FIG. 13. Note that surfing is achieved when fast is high, which also causes a short circuit. Thus, the power consumption for this circuit may be an issue.

Figure 14:
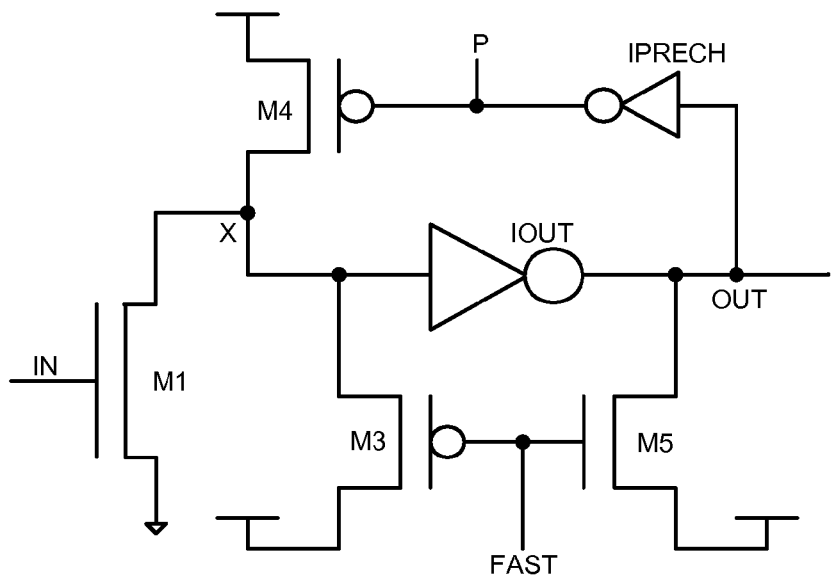
FIG. 14 presents a circuit diagram of an exemplary surfing gate in accordance with some embodiments.
Figure 16:
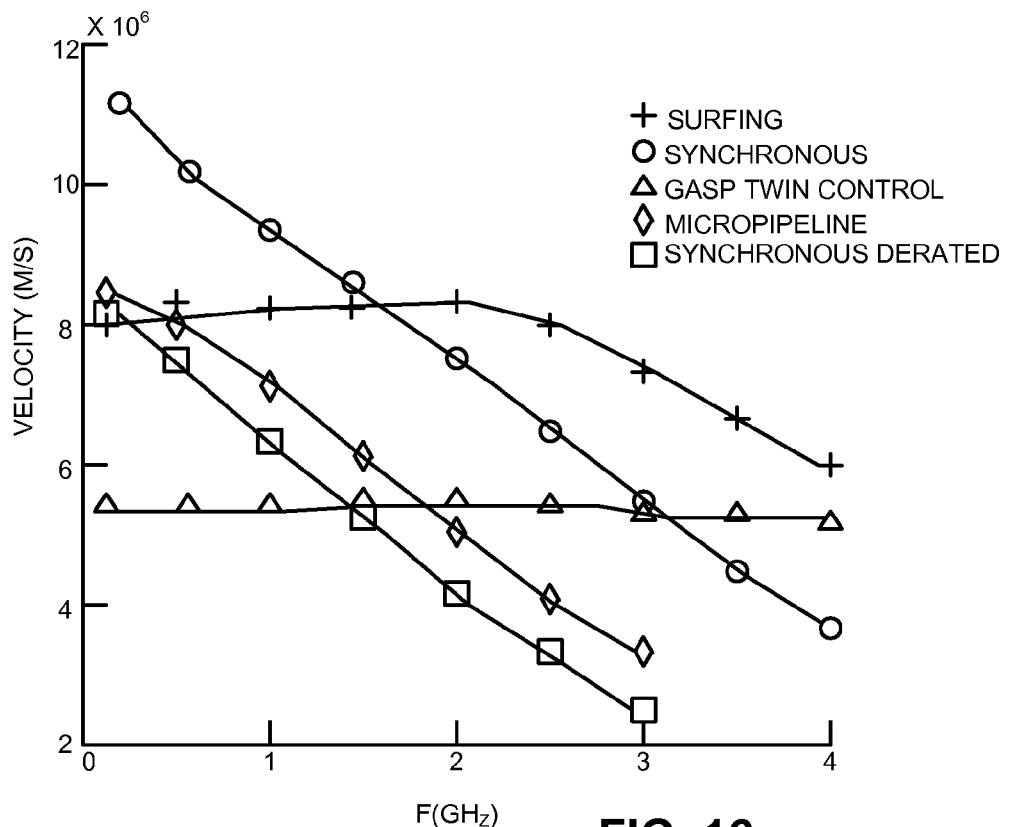
FIG. 16 is an exemplary graph comparing the velocity of signals using different communication techniques as a function of frequency in accordance with some embodiments.
Figure 17:
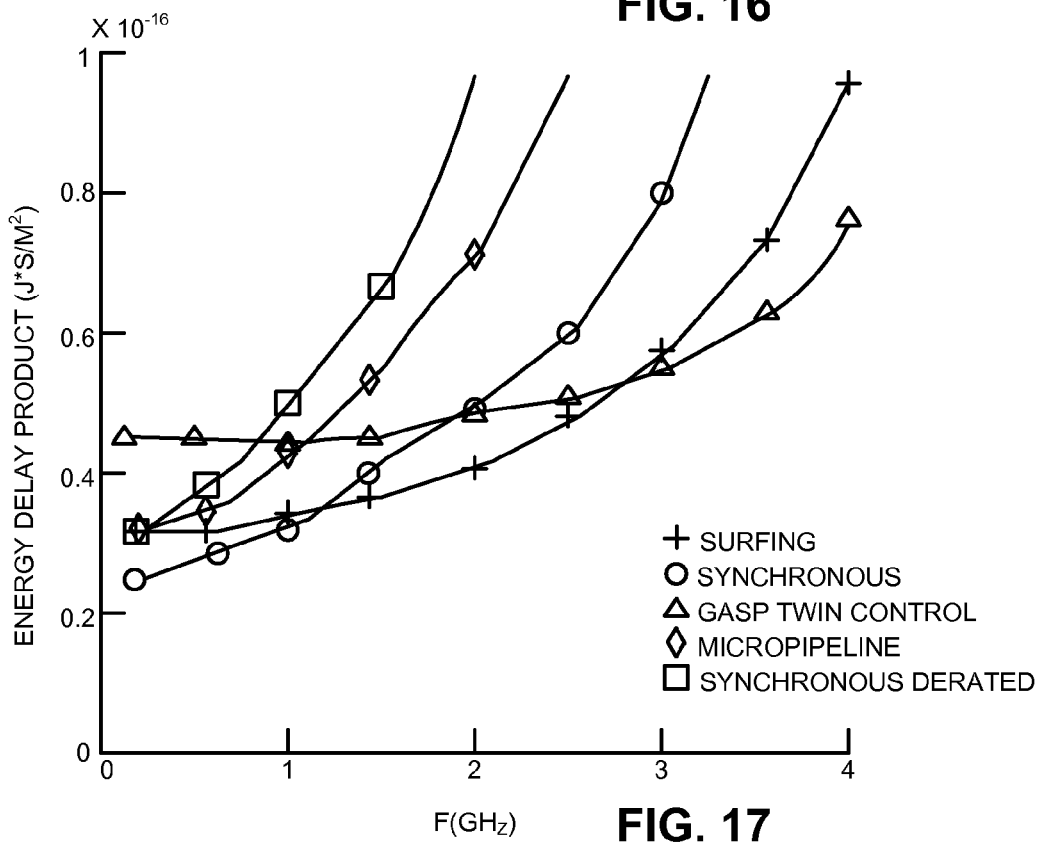
FIG. 17 is an exemplary graph comparing the energy-delay product of signals using different communication techniques as a function of frequency in accordance with some embodiments.
Figure 18:
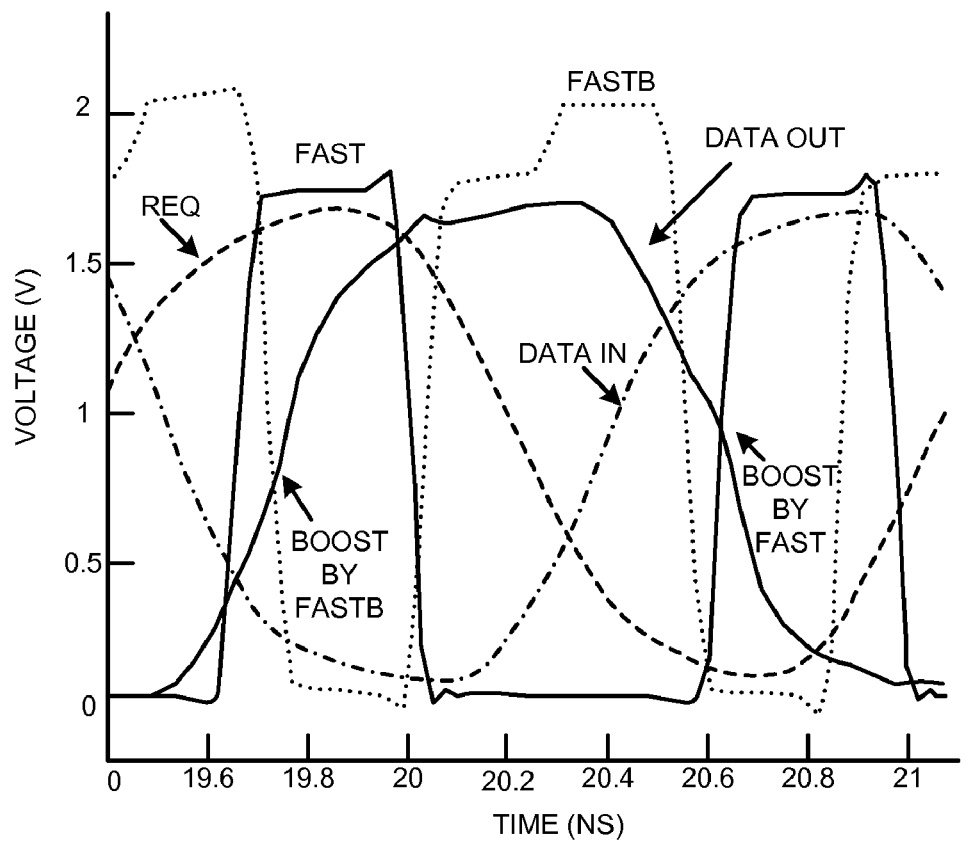
FIG. 18 is an exemplary timing diagram for a surfing interconnect in accordance with some embodiments.

Surfing interconnects can also use traditional buffer insertion techniques. A "soft-latch," as illustrated in FIG. 14, can be used in place of a standard inverter. A "soft-latch" can be considered a static surfing inverter. The inverter 1501 can be used to modulate the driving strength of the inverter 1502. If fast is asserted, the inverter 1501 and the inverter 1502 are both enabled. Thus, the delay of the surfing inverter decreases. Otherwise, only the inverter 1502 is enabled and the delay increases. FIGS. 16-17 show the comparison between the surfing interconnect and tradition buffer insertion techniques. With low throughput, in the sense of delay and energy, the tradition buffer insertion technique performs better than surfing interconnect. When throughput is greater than 1.8 GHz, the surfing interconnect performs better than the traditional technique. The delay of a surfing inverter can be greater than a non-surfing inverter. Hence, the surfing interconnect does not obtain negative overhead. This explains why with slow throughput, the traditional buffer-insertion technique performs better than the surfing interconnect technique. It is reasonable to assume that the data signal and clock signal have slow rising and falling edges. As shown in FIG. 18, the rising edge of the data signal is around 1 ns and falling edge is around 400 ps respectively. Presently surfing interconnect techniques ignore wave pipelining of interconnect because there is little CAD tool support and the timing constraints for wave pipelining are difficult to satisfy. Nevertheless, wave pipelining can improve the throughput of synchronous communication systems. Surfing can simplify the timing analysis by bounding the difference between the data and strobe. At the output of the surfing interconnect, the surfing interconnect can keep a fixed phase with the timing signal. The timing spread between the data signal and the timing signal for synchronous communication can increase along the stages until failure occurs. Hence, the surfing interconnect is more robust to temperature variation, power supply variation and input jitter. Present surfing interconnects are robust against noise, but the timing chain uses a traditional inverter chain. Therefore, these surfing interconnects are not true surfing interconnects and its jitter can accumulate. Due to the drafting effect, long chains of inverters can drop pulses. Thus, the timing chain can become a bottleneck of this design technique for high throughput and long distance communication.

Figure 15:
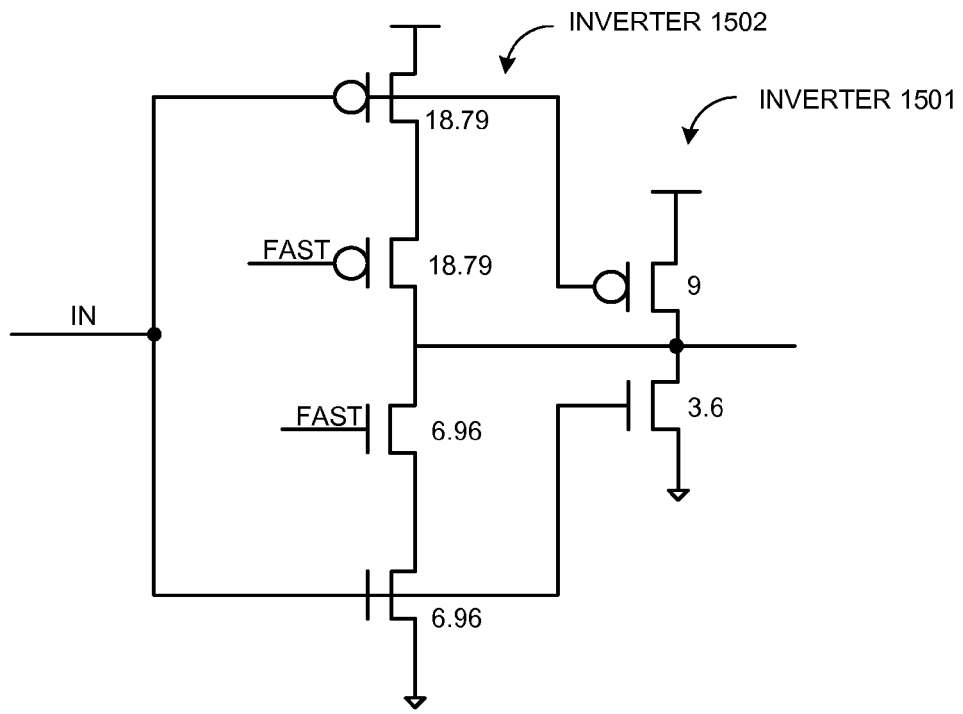
FIG. 15 presents a circuit diagram of an exemplary buffer for a surfing interconnect in accordance with some embodiments.
Figure 19:
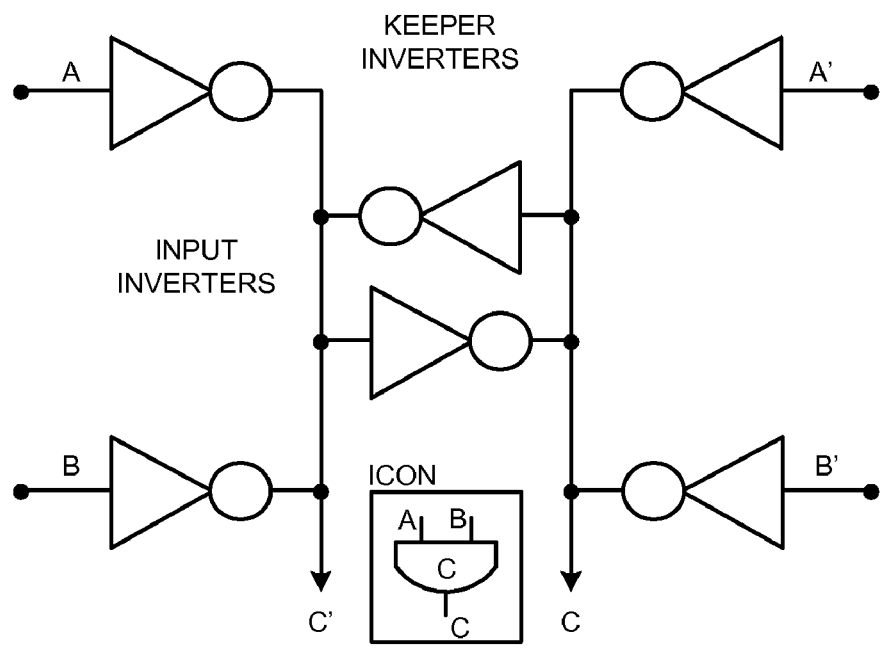
FIG. 19 is a circuit diagram of an analog micropipeline in accordance with some embodiments.
Figure 20:
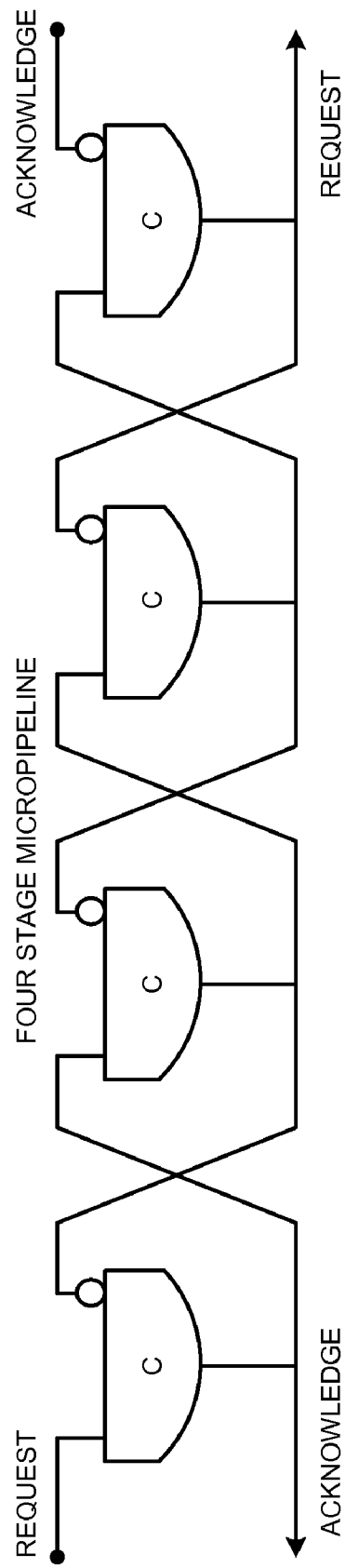
FIG. 20 is a circuit diagram of an exemplary closed-loop micropipeline ring in accordance with some embodiments.
Figure 21:
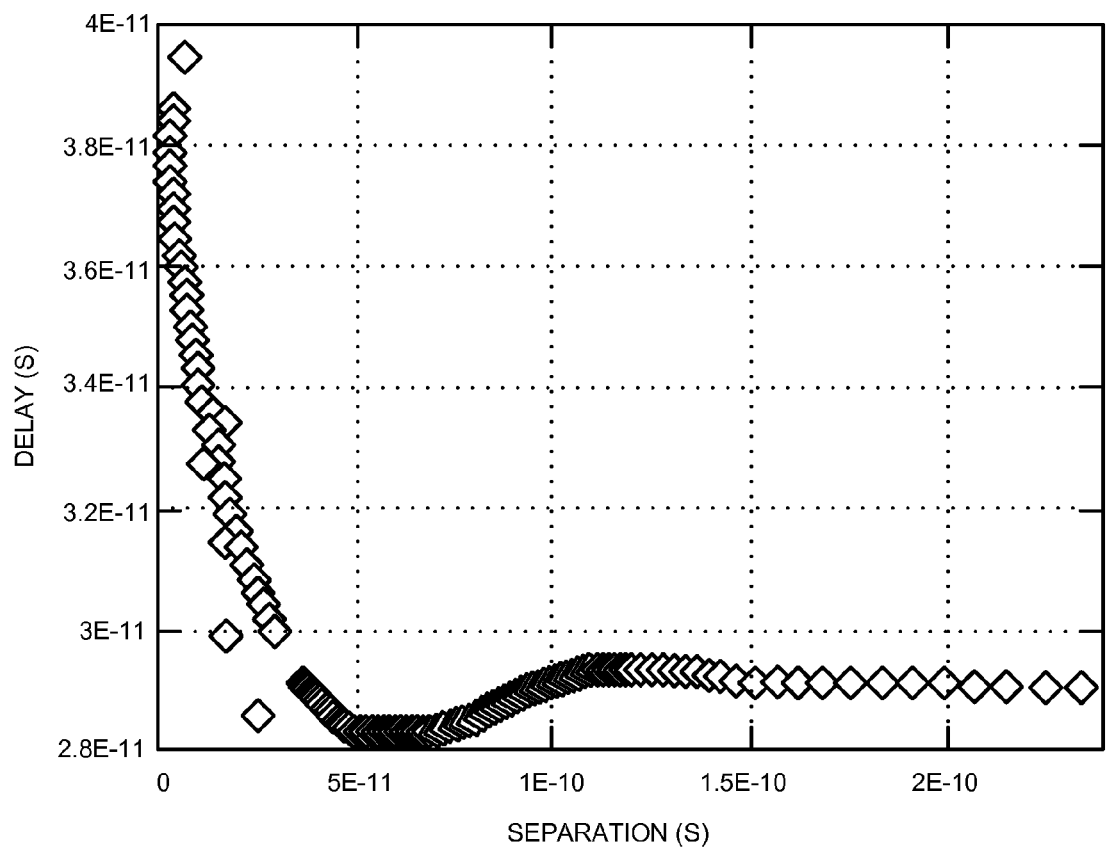
FIG. 21 is an exemplary graph illustrating the delay of a closed-loop micropipeline ring as a function of the separation each element in accordance with some embodiments.

An analog micropipeline ring can be used for high precision timing. A digital C-element in the micropipeline is replaced with an analog C-element as shown in FIG. 19. The analog C-element illustrated in FIG. 19 can be used in a closed-loop micropipeline ring as shown in FIG. 20 to generate precise timing. In the closed-loop ring, the analog C-element demonstrates the delay behavior as shown in FIG. 21. Note that the delay curve is not monotonically decreasing with the separation time between the two input arrival times. This local minimum brings the ring into lock. The delay of analog-C element is linear with respect to the power supply. Compared to the surfing circuit as shown in FIG. 15, the analog C-element consumes a fair amount of short circuit power if input separation time increases.

Figure 22:
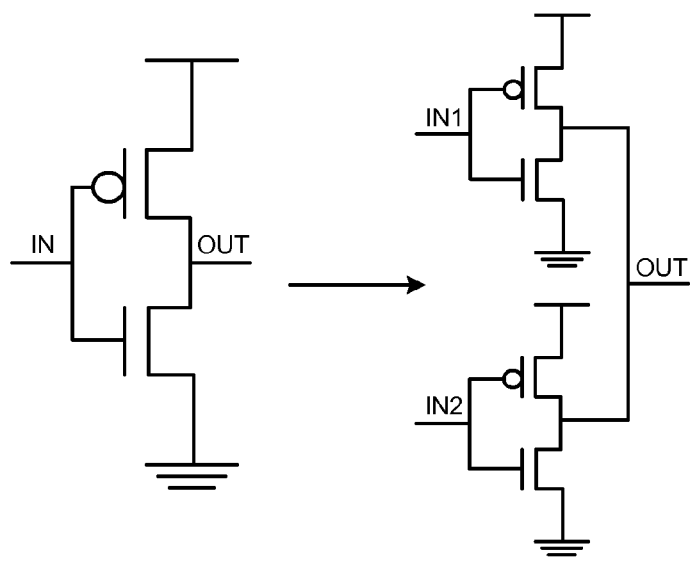
FIG. 22 is a circuit diagram of an exemplary dual-input inverter in accordance with some embodiments.
Figure 23:
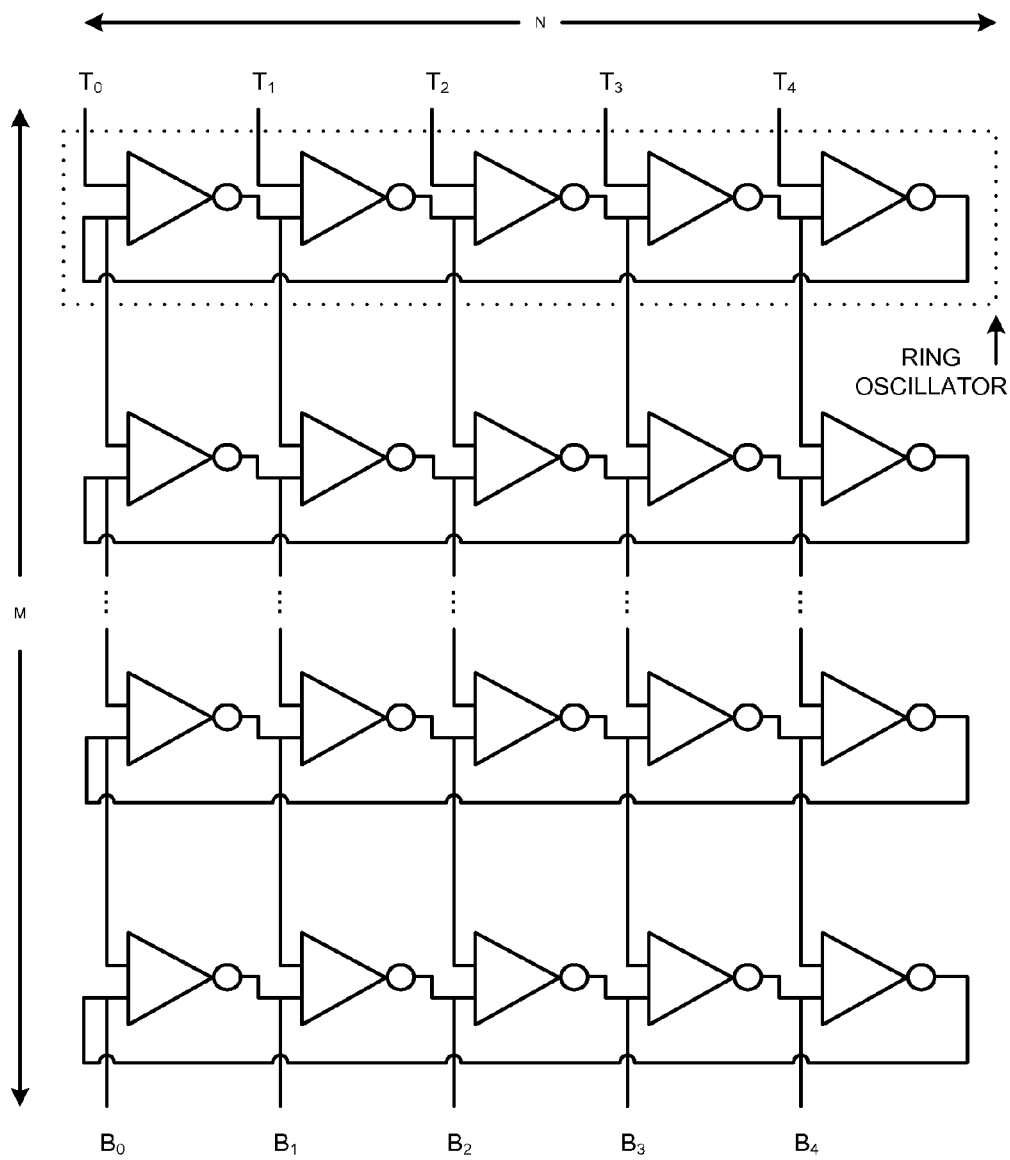
FIG. 23 is a circuit diagram of an exemplary ring including dual-input inverters in accordance with some embodiments.

Another technique splits a single input inverter into a dual input inverter in a shunt configuration as shown in FIG. 22. This circuit's delay is dependent on the arrival time of the two inputs. Similar to the static surfing circuit shown in FIG. 15, this circuit also demonstrates the surfing property. However, in this circuit, the surfing property is achieved by the short circuit current between the two inverters. Assume now in1 and in2 are high and out is low. If in1 goes to low earlier than in2, the upper inverter will drive out to be high and the bottom inverter continues to drive out low. As a result, the voltage on out will boost to an intermediate voltage level between ground and $V_{DD}$ and then go the rest of the way to $V_{DD}$ once in2 goes to low. FIG. 23 shows a ring constructed out of dual-input inverters to obtain high precision timing signals. One inverter of the dual-input inverters forms a ring and another inverter couples the rings together and adjusts the phase relationship between the rings. This structure forms an array oscillator which produces a precise delay resolution equal to the buffer delay divided by the number of rings. However, this array structure has several stable operation modes and the actual mode obtained depends on the initial condition. Thus, the ring needs auxiliary circuits to set the ring in the desired stable operation mode.

LC Signalling

Figure 24:
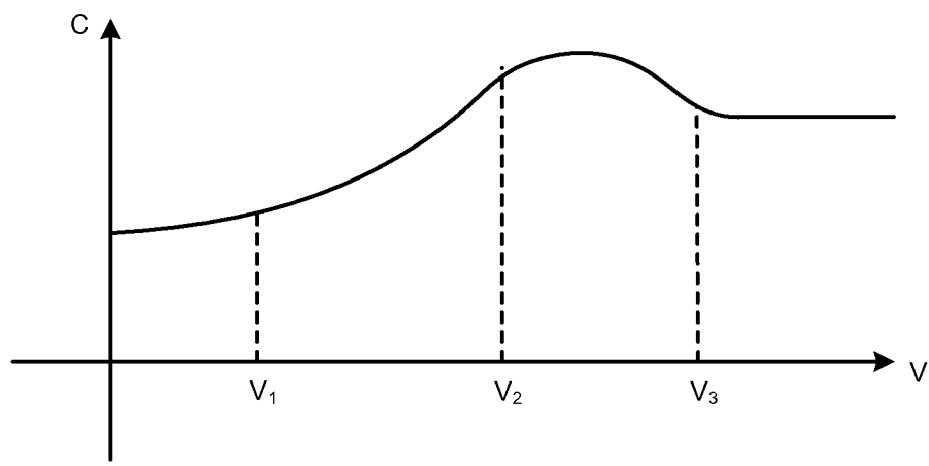
FIG. 24 is a capacitance versus voltage graph for an exemplary accumulation-mode MOS varactor in accordance with some embodiments.

A variable capacitance can be inserted into transmission lines using MOSFET varactors. This variable capacitance can narrow pulse width and sharpen edges. However, the line resistance can cause the pulse to spread out instead. Thus, the variable capacitance can help cancel the dispersive property of lossy lines. However, if the input pulse is wide enough, the line cannot concentrate the input pulse into a signal pulse, and instead, the wide input pulse may spread into multiple narrow soliton pulses. A gradual scaled nonlinear transmission line can be used to gradually narrow the pulse and to prevent the pulse from splitting into multiple pulses. Due to polysilicon depletion and short channel charge quantization effects, the capacitance of an accumulation-mode MOS varactor drops after $V_2$ as shown in FIG. 24. This nonmonotonically increasing capacitance curve allows the varactor shunted line to sharpen a signal on both the rising edge and falling edge. However, the interconnect must be biased at the voltage $V_2$, the local maximum. This voltage level may vary with power supply variation, temperature variation and parameter variation. Note that the capacitance curve is not symmetric around $V_2$. Thus, the sharpening strength of the varactor is not the same for the rising edge and falling edge.

In a surfliner interconnect, distributed shunt conductance is intentionally added to the line to mitigate of velocity dispersion problem. In theory, if G=RC/L, there will be no velocity dispersion along the line and all frequency components attenuate at the same rate and propagates at the speed-of-light. The disadvantage of this approach is that the attenuation constant increases from $R/(2Z_0)$ without shunt conductance to $R/Z_0$. Hence, a surfliner interconnect consumes more power than the typical interconnect without shunt conductance. The high attenuation rate can also limit the length of the interconnect.

A pulsed current-mode signaling technique can be used to achieve nearly speed-of-light for intra-chip communication. The voltage swing at the end of a differential, 3 mm long transmission line is approximately 120 mv, which requires careful design of the receiver. Although an exemplary driver may only consume 0.29 pJ/bit, the DLLs, skewing and deskewing latches can consumes up to 3.1 pJ/bit. Hence, more than 90% of power consumption is spent on the transmitter and receiver for deskewing compensation. Note that the latency is almost doubled due to the distributed amplifier configuration.

The baseband signal can be converted to an RF signal to transmit symbols at the speed of light. This converter circuit includes: a receiver, a transmitter, an oscillator to generate the high frequency carrier, and a differential interconnect. A 1 GHz signal can be modulated onto a 7.5 GHz carrier, for example, to ensure LC regime transmission. The advantage of this technique is that an input symbol only contains a narrow range of frequency components. Thus, frequency dispersion is not a problem in this technique. In an exemplary design with a 16 μm wide, 20 mm long differential line with 0.18 μm CMOS technology, the delay is 300 ps. The circuit, including the receiver, transmitter and the oscillator to generate the high frequency carrier, can consume 16.1 mW and can support a throughput of 2 Gb/s. Jitter and skew can exist between the carriers at the transmitter and receiver side. This jitter and skew can limit the throughput and can require extra circuits to deal with the timing uncertainty.

Figure 25:
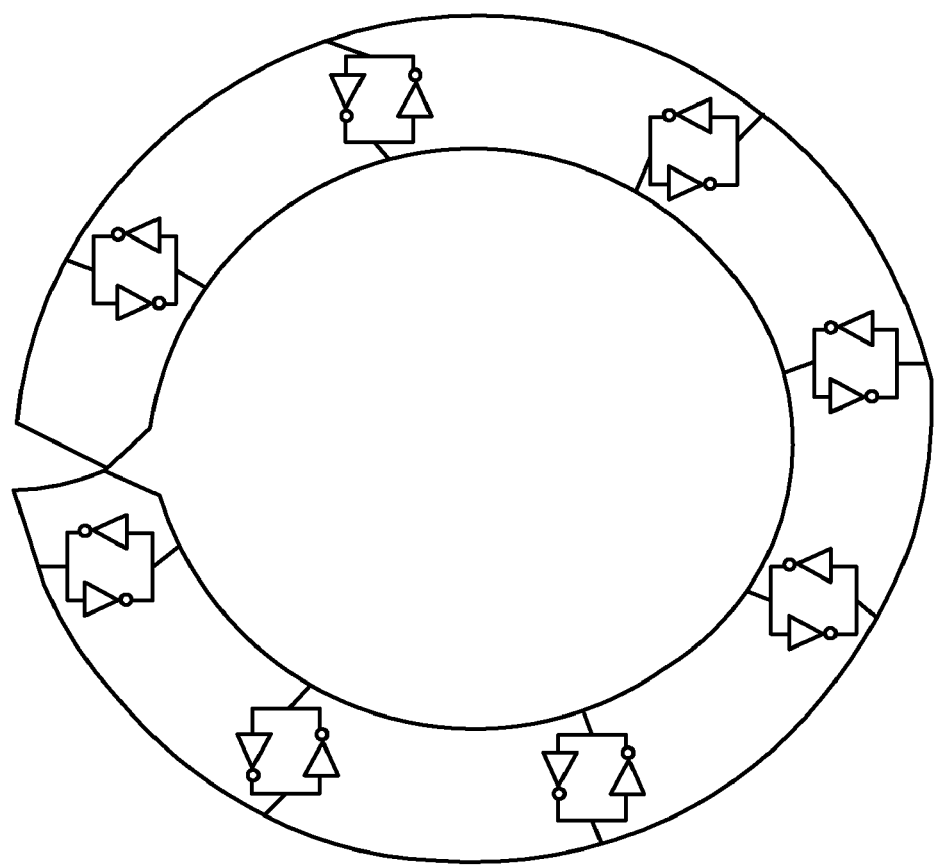
FIG. 25 is a circuit diagram of a travelling wave oscillator circuit in accordance with some embodiments.
Figure 26:
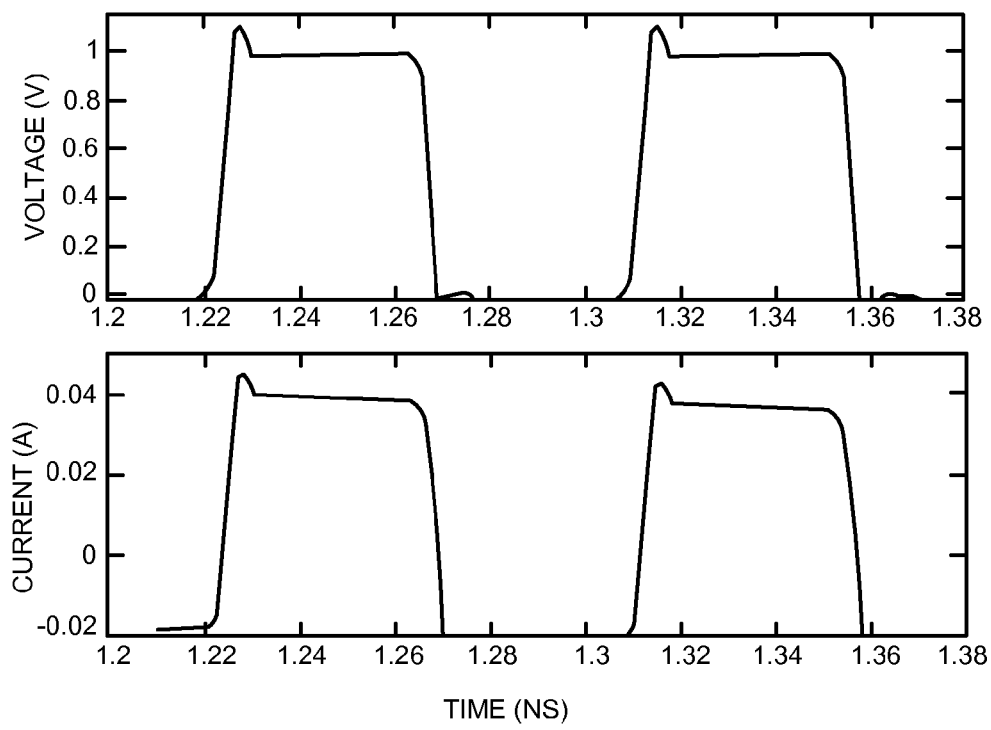
FIG. 26 is a timing diagram of an exemplary traveling wave oscillator in accordance with some embodiments.

A travelling wave oscillator, as shown in FIG. 25, can be used. The travelling wave oscillator is a closed-loop differential LC line. If there is no resistance on the line, the waves with opposite phases can propagate along the line forever. Distributed amplifiers (e.g., cross-coupled inverters) can be used to compensate the energy loss consumed by the line resistance. The cross-coupled inverters have at least two functions. During a transition, the cross-coupled inverters work as an amplifier to sharpen the edges. After the transition, the cross-coupled inverters function as latches to keep the state on a segment. The travelling wave oscillator is attractive for two reasons. First, edges are very sharp. FIG. 26 shows the operation of the travelling wave oscillator with an exemplary 90 nm process. The edges are only approximately 10 ps. Second, power consumption is low. The distributed amplifiers only provide the energy consumed by the line resistance. Thus, the line resistance must be small enough. In other words, the line should be wide enough.

Note that techniques for LC signaling can be divided into two categories: passive and active. An active compensation approach provides energy to the wire for long distance interconnects. A passive approach provides no energy compensation and focuses on velocity dispersion only. Nonlinear transmission lines do not provide energy compensation because the other end of the varactor is typically connected to a DC voltage supply. In some embodiments, the varactor can also provide energy to the wire if the other end is connected to an AC voltage source.

Surfing RC Signaling

Figure 27:
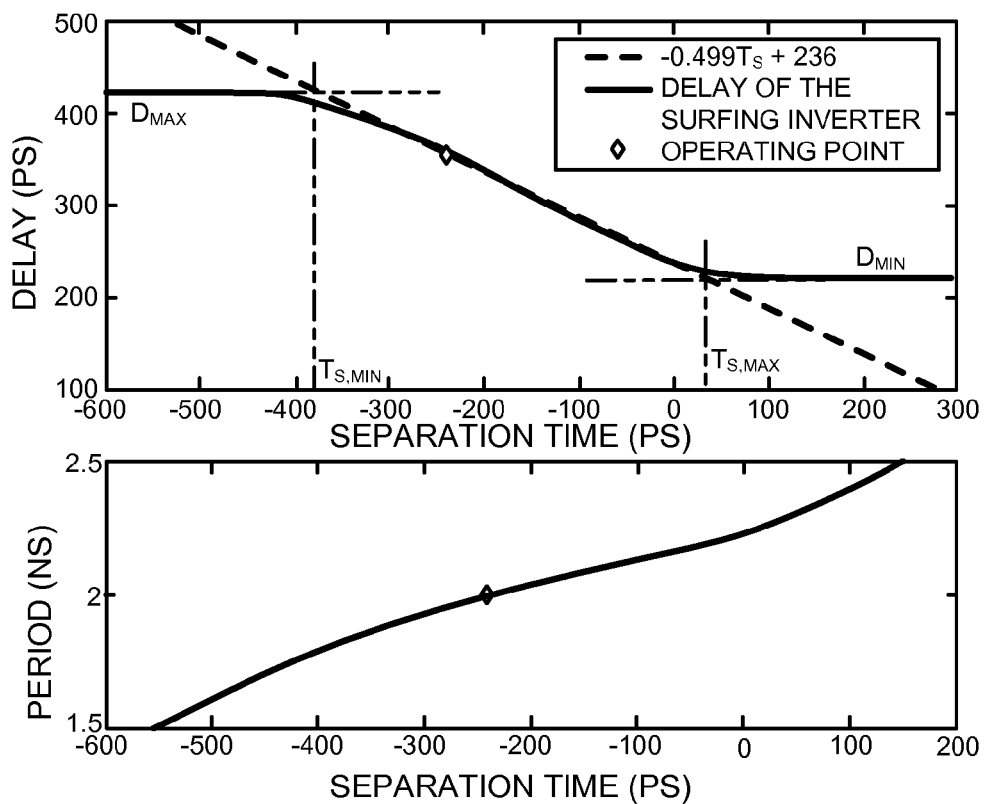
FIG. 27 present exemplary graphs for delay versus separation time and period versus separation time in accordance with some embodiments.

In some embodiments, a static surfing buffer, as shown in FIG. 15, is used during buffer insertion to achieve RC signaling. The variable strength of this buffer can be used to implement controlled delay variations required for surfing circuits. The delay curve is shown in FIG. 27. The variable delay helps to synchronize the data signal with the fast signal.

Figure 28:
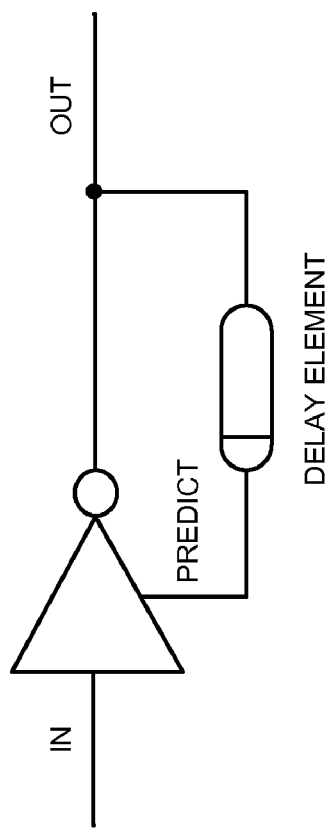
FIG. 28 is a block diagram of an exemplary surfing delay locked loop in accordance with some embodiments.

An interconnect used to transmit the strobe signal can be different from the interconnect used to transmit data. Instead of using a static surfing buffer, a surfing Delay locked loop (DLL) as shown in FIG. 28, can be used to overcome the intersymbol interference in the buffer chain. This approach has the following advantages: (1) the surfing inverter combines the function of the variable delay element and phase detector; (2) the surfing design makes use of the fact that for a clock signal, 1s and 0s are interleaved each cycle which makes it straightforward to accurately estimate when the next event should happen; and (3) in a DLL configuration, the output time of this surfing inverter is a weighted average of the arrival time of the input clock and the predicted time for the next event. This averaging avoids the problems of "jitter peaking" that are typically associated with DLLs.

Figure 29:
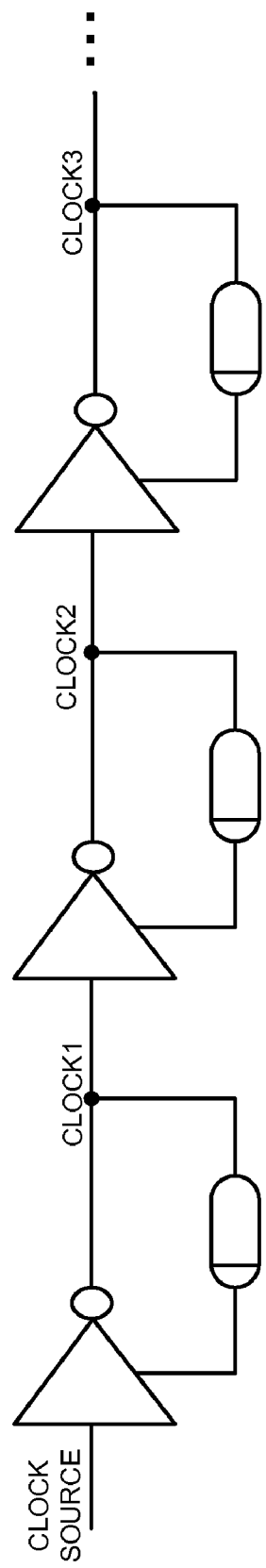
FIG. 29 is a block diagram of an exemplary surfing DLL line in accordance with some embodiments.
Figure 30:
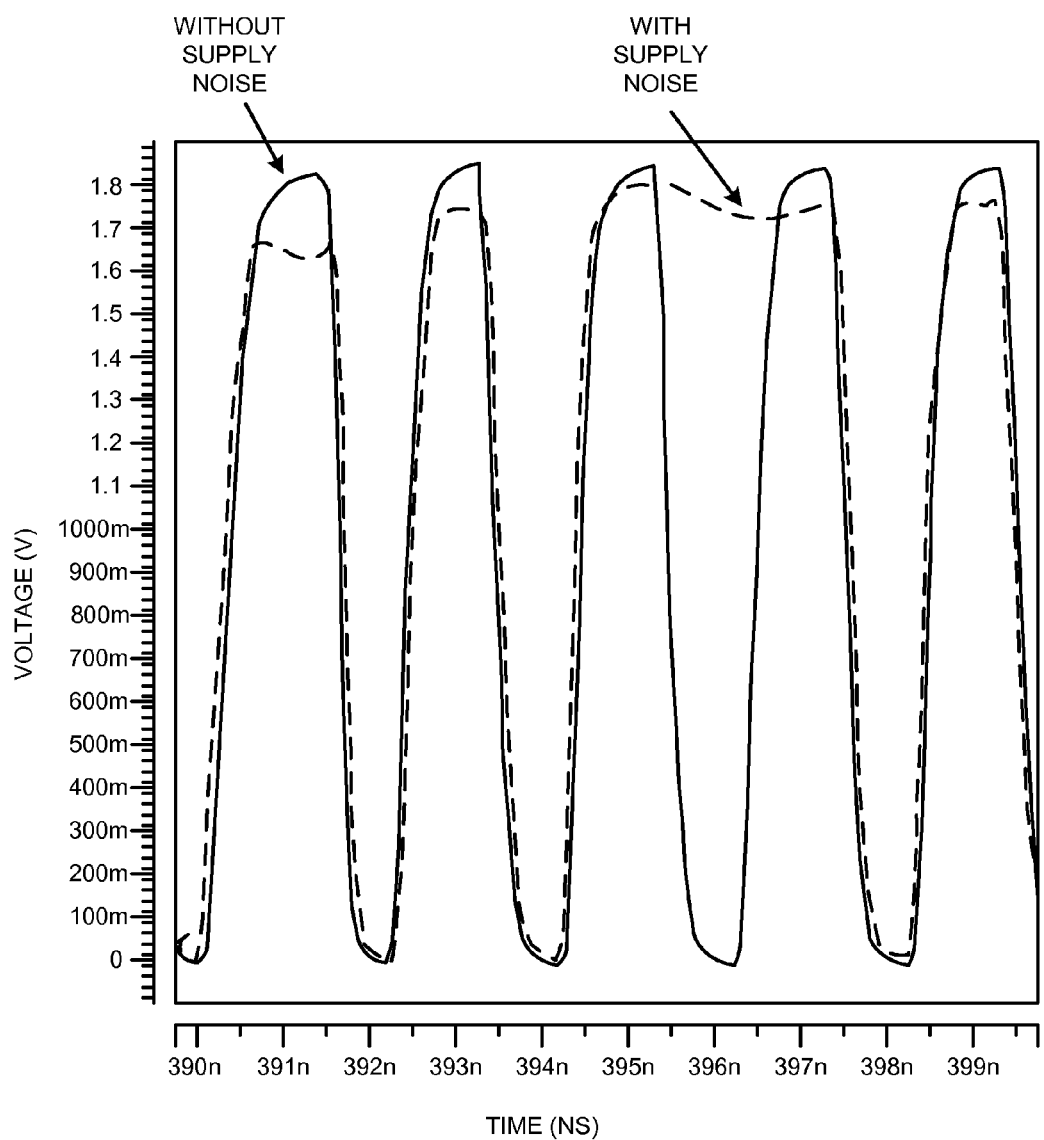
FIG. 30 is a timing diagram of an exemplary surfing DLL in accordance with some embodiments.
Figure 31:
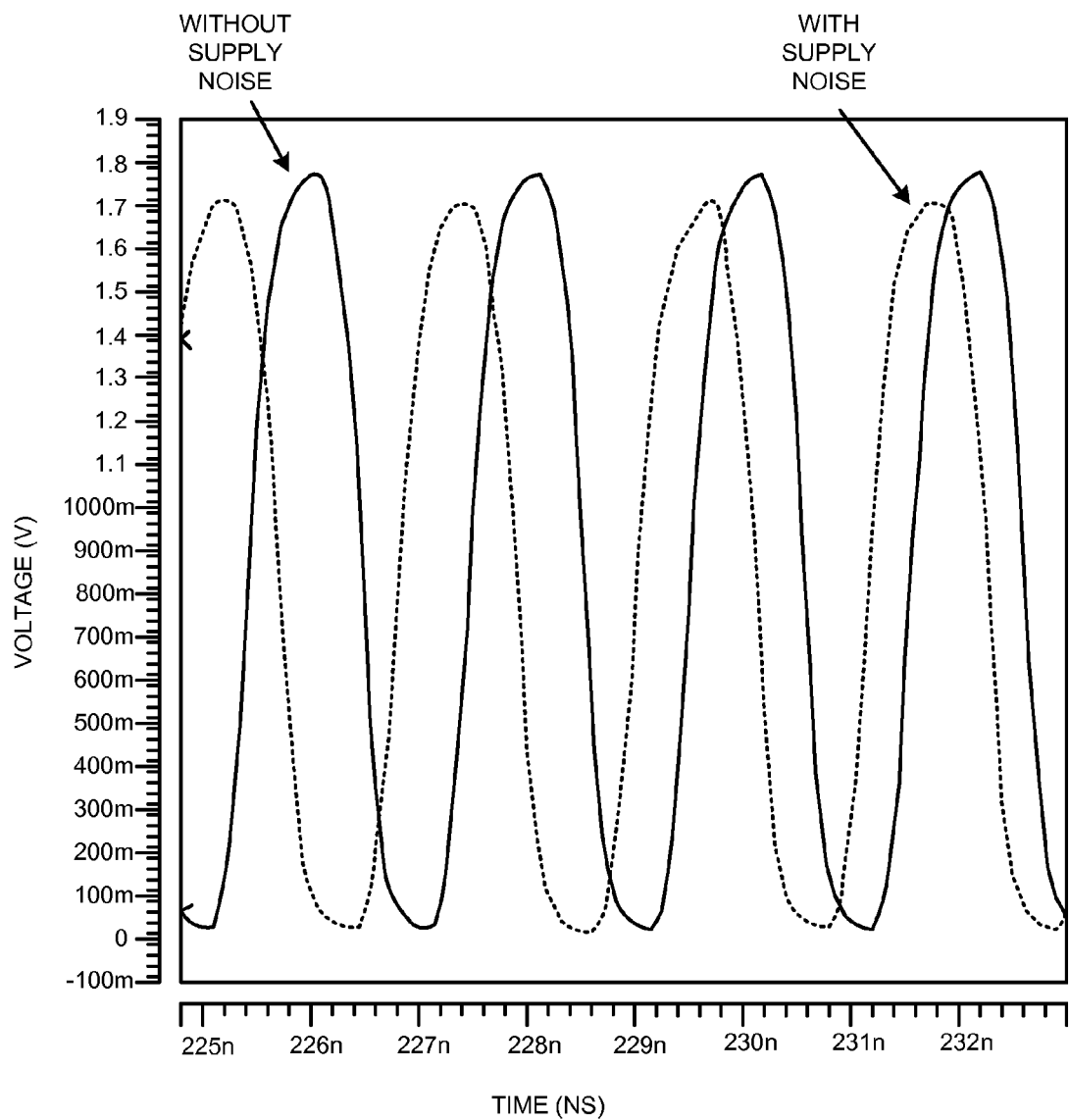
FIG. 31 is a timing diagram of an exemplary surfing DLL in accordance with some embodiments.

Surfing DLLs can drive long wires to build chains connected to propagate timing signals for cross-chip communication as shown in FIG. 29. An analytical model based on a linear approximation of the timing shows that disturbances are spread out over the pipeline. This results in an attenuation of random input jitter. Due to the surfing effect, the surfing inverter chain is less sensitive to power supply noise than a simple inverter chain. This inverter chain was simulated in an exemplary 0.18 μm process with a PMOS width of 18.45 μm and an NMOS width of 7.1 μm. In FIG. 30, the solid curve is the output of the $200^{th}$ stage with no power supply noise and the dashed curve is the output of the same stage but with $V_{DD}$ varying randomly in [1.62V, 1.8V] (1.8V is the nominal $V_{DD}$ for the TSMC 0.18 μm process). With no power supply noise, the inverter chain can propagate the pulses through 200 stages at 500 MHZ without losing pulses. However, with $V_{DD}$ varying randomly in [1.62V, 1.8V], the chain loses pulses. We applied the same power supply noise to the surfing inverter chain. FIG. 31 shows the output of the $200^{th}$ stage with and without power supply noise. We simulated a 200-stage chain for 250 ns. At each stage of the chain, we measured the cycle-to-cycle variation in the period (the relative jitter). Along the surfing chain, relative jitter has a maximum of 9.1% and the standard deviation is 1.5%. In particular, the chain shows no jitter accumulation: at each stage, the power supply noise injects new jitter, but the surfing inverter also attenuates its input jitter.

Figure 32:
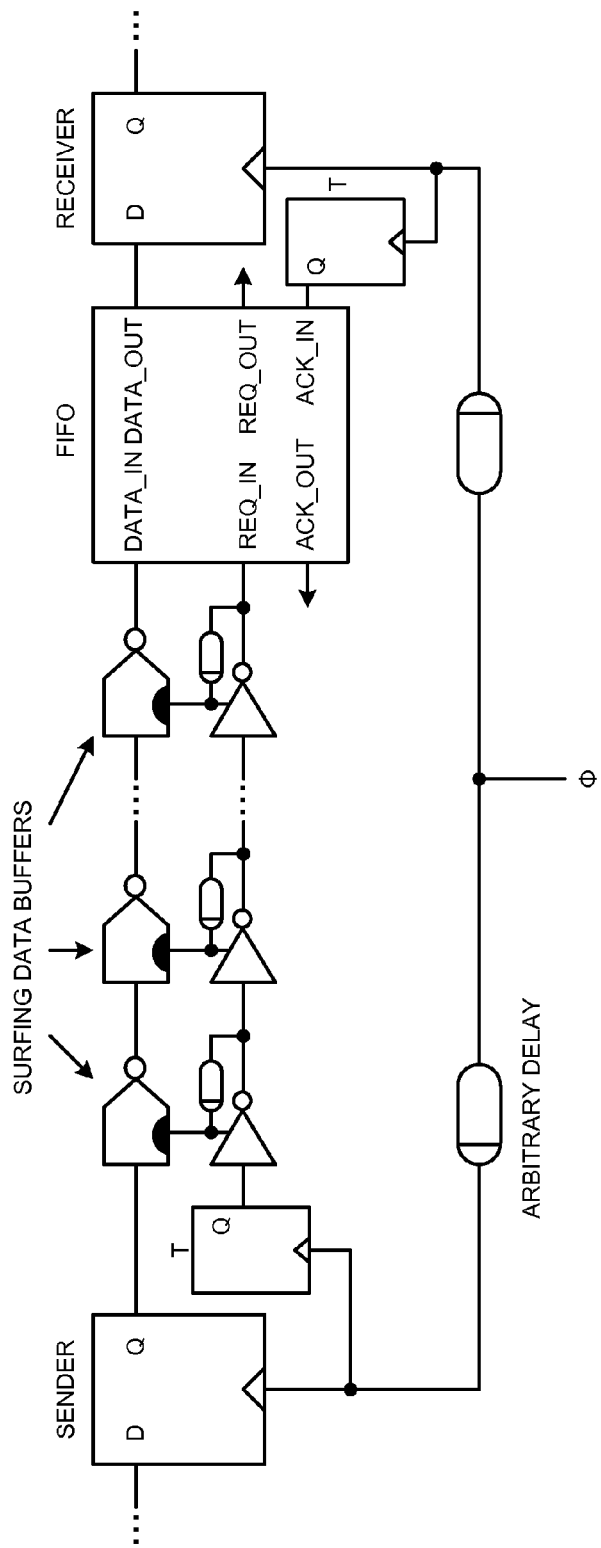
FIG. 32 is a block diagram of an exemplary source-synchronous communication system in accordance with some embodiments.

A source source-synchronous communication system can be constructed from surfing DLLs as shown in FIG. 32. A strobe signal can be used to control the delay of the data signal such that the data signal are in phase with the strobe signal.

These surfing DLLs can be designed to accommodate a delay variation of roughly±30% around the nominal delay. This ensures that the surfing designs can compensate intra-chip variations in device parameters, $V_{DD}$ and temperature (i.e. on-chip PVT). Greater range of operation can be obtained by increasing the size of the tri-state inverter relative to the simple inverter in FIG. 15 at a cost of an increase in the overall delay of each surfing inverter.

LC Signaling

The above technique can be extended to LC signaling. The main advantage of LC signaling is higher velocity than RC signaling. Jitter may also be reduced because LC delays are relatively insensitive to power supply voltage, temperature and fabrication parameters.

Figure 33:
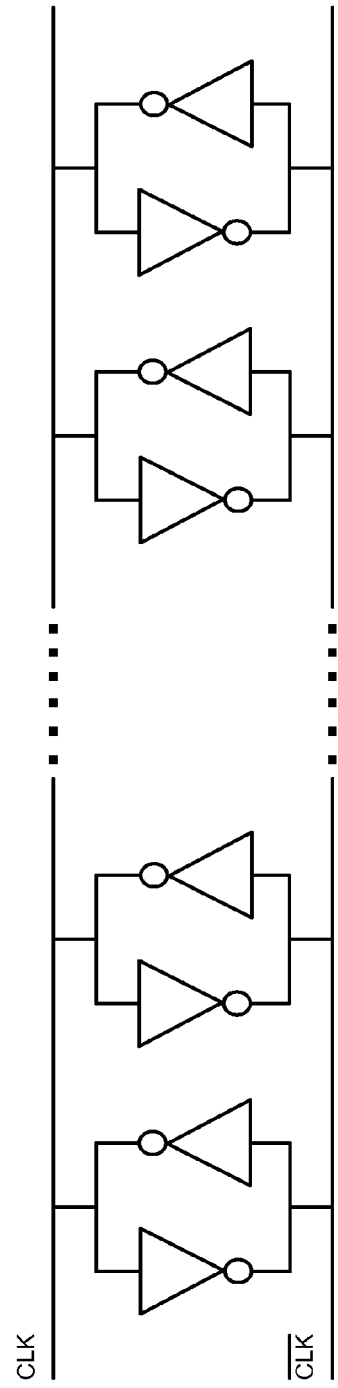
FIG. 33 is an exemplary transmission line in accordance with some embodiments.

The transmission line as shown in FIG. 33 is a variation of a rotary travelling wave. Instead of using a closed-loop transmission line, the loop is open so that data can be transmitted. Because the signal is full swing, the cross-coupled inverters do not consume static power. Furthermore, the inverters are saturating and provide noise immunity. The main cause of energy loss in these lines is due to the wire resistance, and the cross-coupled inverters provide the energy to restore this loss and allow signals to propagate reliably down an arbitrarily long line. To minimize power consumption, the resistance of the lines can be reduced by using wide wires. This increases the capacitance, thus, relatively wide wire spacing must be used to achieve acceptably high line impedance.

Figure 34:
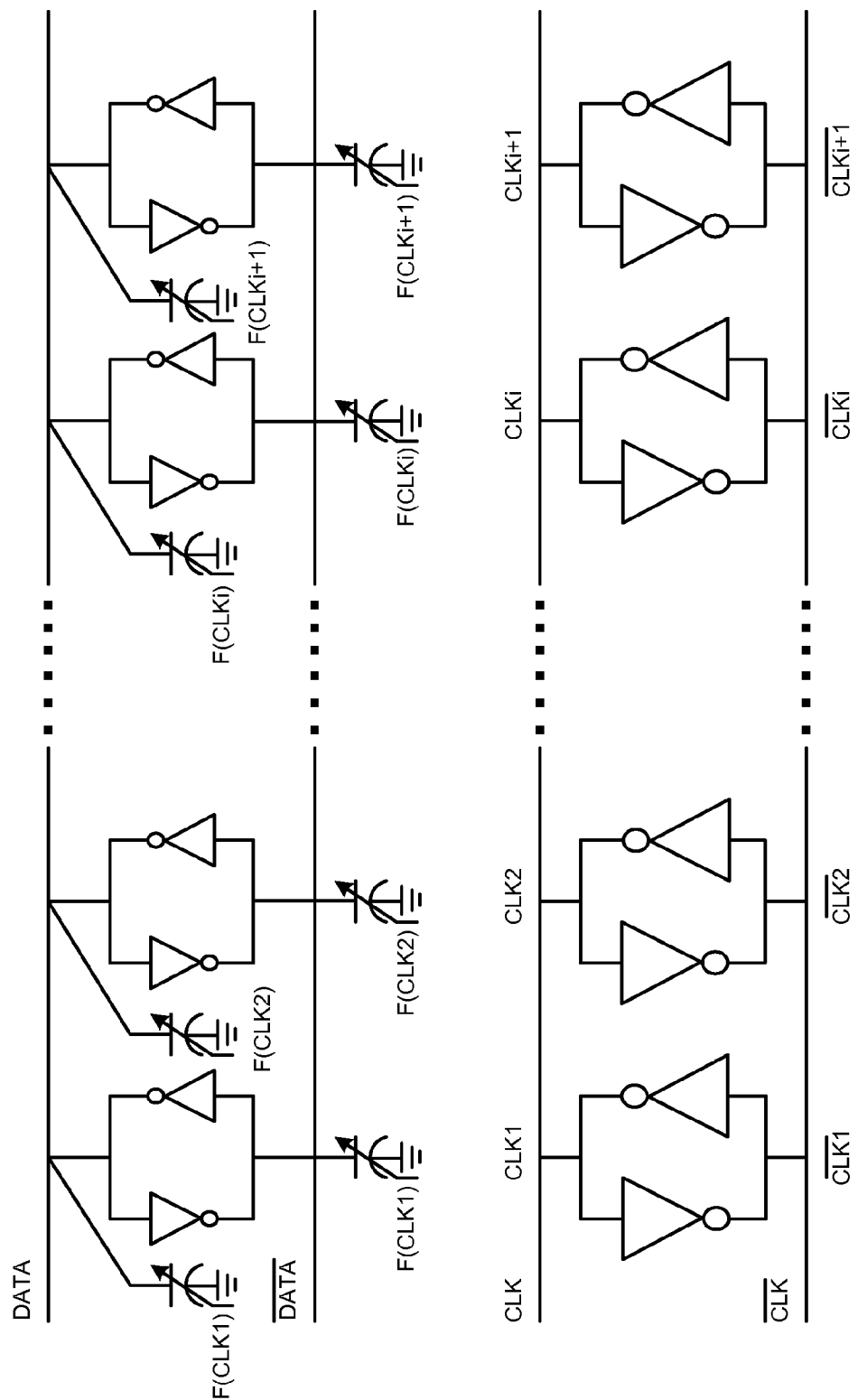
FIG. 34 is an exemplary transmission line in accordance with some embodiments.
Figure 36:
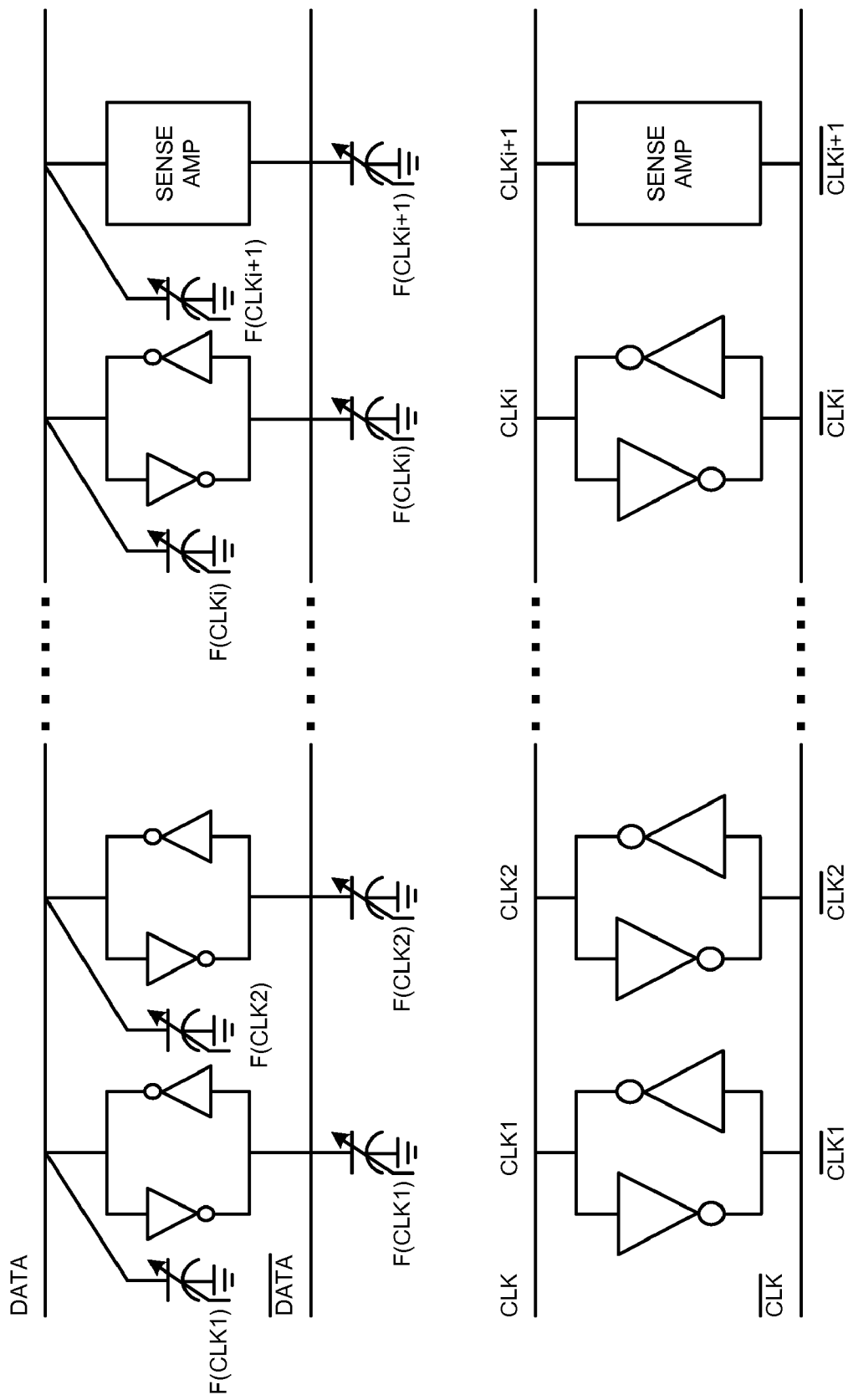
FIG. 36 is an exemplary transmission line that includes a negative conductance device that is a sense amplifier in accordance with some embodiments.

LC signaling requires a new type of surfing circuit. Previous surfing circuits do not apply to this technique because the propagation velocity is mainly dependent on the inductance and capacitance in the line. Thus, in some embodiments, varactors are used for surfing as shown in FIG. 34. Negative conductance devices (e.g., cross coupled inverters) can be used to provide energy compensation (also, as shown in FIG. 36, in some embodiments a negative conductance device includes a sense amplifier). Unlike a nonlinear transmission line, the varactor in the surfing design is controlled by the clock signal such that the capacitance decreases when transitions are expected. Thus, this design does not require the capacitance of the varactor to be set at the local maximum. The delay of the transmission line is a function of varactor's capacitance value, and the decrease in this capacitance is affected by changes in the clock voltage. This variable delay should satisfy the surfing timing equation (1) which gives the minimum interval of the varactor capacitance value. The transistor gate capacitance, drain capacitance or diode capacitance may all be used as varactors.

The data line and clock line do not necessarily have the same width and spacing. Assume that they have the same width and spacing. Because the two lines run at the same speed, the total capacitance of the two lines must be the same. Thus, the cross-coupled inverters in the data line must be smaller than those in the clock line. Because the cross-coupled inverters in the data line are large enough to compensate the energy loss, the cross-coupled inverters in the clock line overcompensate the energy loss. Smaller cross-coupled inverters in a wider clock line can be used. The spacing between cross-coupled inverters affects the power consumption of the system. Sharp edges reduce the short circuit power of the inverters. The more distributed the cross-coupled inverters are, the sharper the edges are.

Figure 35:
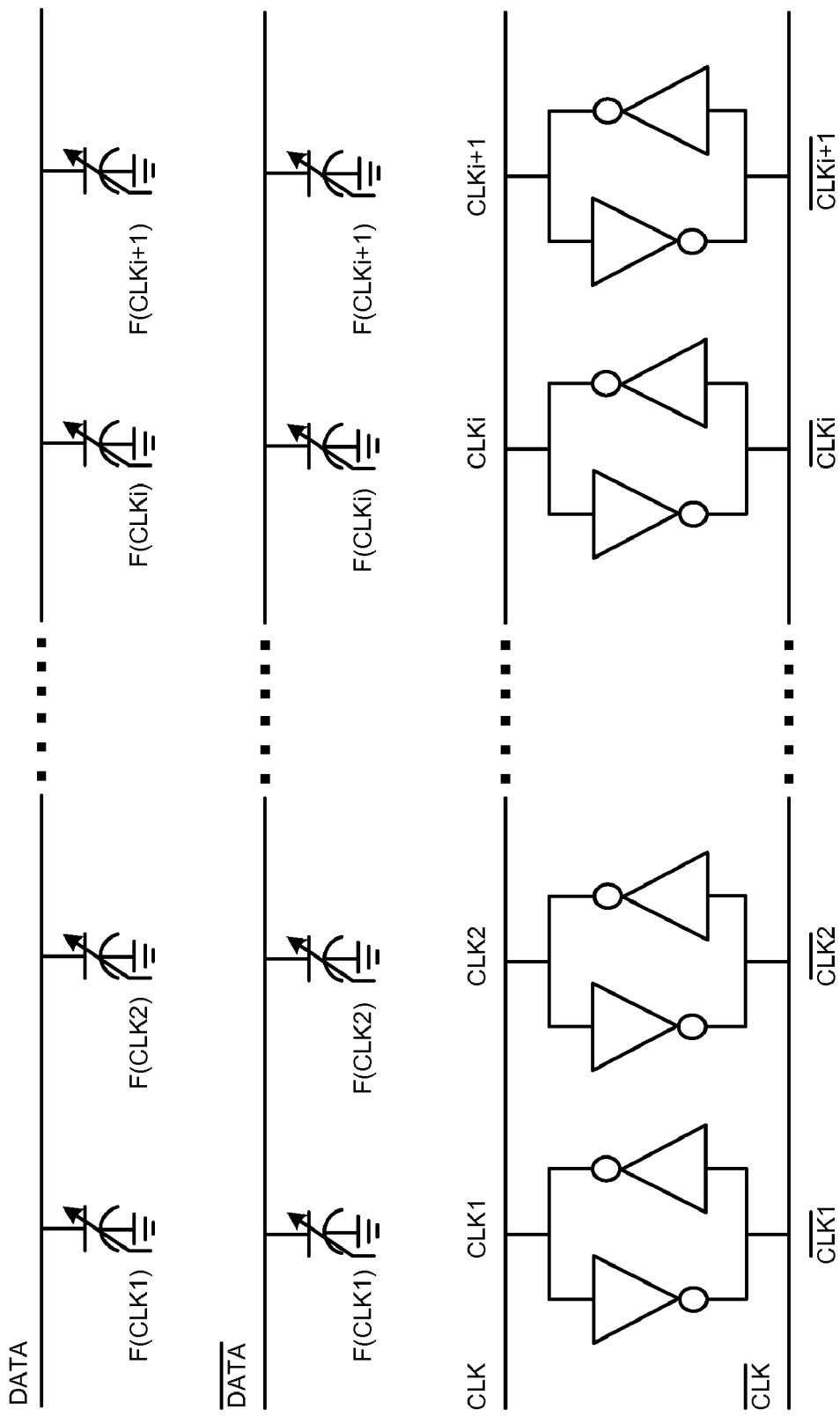
FIG. 35 is an exemplary transmission line in accordance with some embodiments.

In some embodiments, low-swing techniques as shown in FIG. 35 can be used, wherein the cross-coupled inverter pair in the data line is not used in the data line. This varactor scheme sharpens both rising and falling edges of the data signal. Furthermore, charge that is accumulated on the varactor when the signal voltages are low is pushed into the lines by the changing clock signal at higher voltages. Thus, it is possible that the clocked varactor approach can provide energy gain even though it cannot provide additional charge. The low-swing approach may offer lower energy per bit and lower latency than the full-swing design with shunting inverters.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An interconnect, comprising:
   at least one control signal line;
   at least one data signal line; and
   at least one variable capacitor coupled to the at least one control signal line and the at least one data signal line, wherein the capacitance of the variable capacitor is configured to be controlled by a control signal on the control signal line so that a velocity of a data signal transmitted on the at least one data signal line is determined by the value of the capacitance of the variable capacitor, wherein the control signal comprises a clock signal.

2. The interconnect of claim 1, wherein the interconnect is a transmission line.

3. The interconnect of claim 2, wherein the transmission line is operating in an inductance-capacitance (LC) mode.

4. The interconnect of claim 1, wherein the variable capacitor is configured to provide energy gain on the data signal when the clock signal changes.

5. The interconnect of claim 1, including at least one negative conductance device configured to restore a signal level of a signal transmitted on the at least one data signal line.

6. The interconnect of claim 5, wherein the at least one negative conductance device is a sense amplifier.

7. The interconnect of claim 5, wherein the at least one negative conductance device is at least one pair of cross-coupled inverters.

8. The interconnect of claim 1, wherein the variable capacitor is a varactor.

9. The interconnect of claim 8, wherein the varactor is a metal-oxide semiconductor (MOS) transistor.

10. The interconnect of claim 8, wherein the varactor is a PN-junction varactor.

11. The interconnect of claim 1, wherein the at least one control signal line includes at least one negative conductance device.

12. The interconnect of claim 11, wherein the at least one control signal line includes a pair of differential signal lines for a control signal.

13. The interconnect of claim 1, wherein the at least one data signal line includes a pair of differential signal lines for a data signal.

14. The interconnect of claim 1, wherein the interconnect is included in an integrated circuit chip.

15. A computer system, comprising:

a processor; and memory;

wherein the processor includes at least one interconnect comprising:

at least one control signal line;

at least one data signal line; and at least one variable capacitor coupled to the at least one control signal line and the at least one data signal line, wherein the capacitance of the variable capacitor is configured to be controlled by a control signal on the control signal line so that a velocity of a data signal transmitted on the at least one data signal line is determined by the value of the capacitance of the variable capacitor, wherein the control signal comprises a clock signal.

16. The computer system of claim 15, including at least one negative conductance device configured to restore a signal level of a signal transmitted on the at least one data signal line.

17. The computer system of claim 15, wherein the interconnect is a transmission line.

18. The computer system of claim 17, wherein the transmission line is operating in an inductance-capacitance (LC) mode.

19. The computer system of claim 15, wherein the variable capacitor is configured to provide energy gain on the data signal when the clock signal changes.

* * * * *